(12) United States Patent
Seki

(10) Patent No.: US 8,981,231 B2
(45) Date of Patent: Mar. 17, 2015

(54) MOLDED PRODUCT AND IN-MOLD TRANSFER FOIL

(75) Inventor: Atsushi Seki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/125,110

(22) PCT Filed: May 30, 2012

(86) PCT No.: PCT/JP2012/063881
§ 371 (c)(1),
(2), (4) Date: Dec. 10, 2013

(87) PCT Pub. No.: WO2012/176593
PCT Pub. Date: Dec. 27, 2012

(65) Prior Publication Data
US 2014/0124246 A1    May 8, 2014

(30) Foreign Application Priority Data

Jun. 20, 2011    (JP) .................................. 2011-136792
Apr. 24, 2012    (JP) .................................. 2012-098692

(51) Int. Cl.
*B29C 45/16*     (2006.01)
*H05K 1/02*      (2006.01)
*B29C 45/14*     (2006.01)
*B29L 31/34*     (2006.01)

(52) U.S. Cl.
CPC ....... *B29C 45/14688* (2013.01); *B29C 45/1671* (2013.01); *H05K 1/0298* (2013.01); *B29C 45/14811* (2013.01); *B29L 2031/3481* (2013.01); *B29L 2031/3437* (2013.01); *B29C 45/1679* (2013.01)

USPC .......................................... 174/251; 428/195.1

(58) Field of Classification Search
USPC ........................................ 174/251; 428/195.1
See application file for complete search history.

(56) References Cited

U.S. PATENT DOCUMENTS

2005/0271760 A1*  12/2005  Itoh et al. ................... 425/129.1
2012/0055826 A1*   3/2012  Nishimura .................... 206/320
2012/0237726 A1*   9/2012  Kaneuchi et al. ............. 428/141

FOREIGN PATENT DOCUMENTS

| JP | 02-261614   | 10/1990 |
| JP | 09-011275   | 1/1997  |
| JP | 09-183141   | 7/1997  |
| JP | 2000-263589 | 9/2000  |
| JP | 2004-074442 | 3/2004  |
| JP | 2005-178154 | 7/2005  |
| JP | 2009-009859 | 1/2009  |
| JP | 2011-011523 | 1/2011  |
| JP | 2011-208041 | 10/2011 |

(Continued)

*Primary Examiner* — Timothy Thompson
*Assistant Examiner* — Charles Pizzuto
(74) *Attorney, Agent, or Firm* — K&L Gates LLP

(57) ABSTRACT

Provided is a molded product including a primary molded layer, a transfer layer that includes at least a decorating layer and a print layer for foil flow prevention including one of polyester, polyurethane, polyimide and cellulose, or a mixture obtained by combining two or more of polyester, polyurethane, polyimide and cellulose as a main component, and is transferred to a surface of the primary molded layer, the decorating layer and the print layer for foil flow prevention being arranged in increasing order of distance from a side of the primary molded layer, and a secondary molded layer formed on the side of the print layer for foil flow prevention of the transfer layer.

5 Claims, 19 Drawing Sheets

3 BASE FILM
10' PRIMARY MOLDING RESIN
20' SECONDARY MOLDING RESIN
30 TRANSFER LAYER
30' IN-MOLD TRANSFER FOIL
31 PRINT LAYER
32 CONDUCTIVE WIRE LAYER
33 DECORATING LAYER
34 BONDING LAYER

A

B

C

(56) References Cited

FOREIGN PATENT DOCUMENTS

| JP | 2012-071554 | 4/2012 |
| WO | 99/50065 | 10/1999 |
| WO | WO 2013/044584 * | 4/2013 |

* cited by examiner

FIG. 9
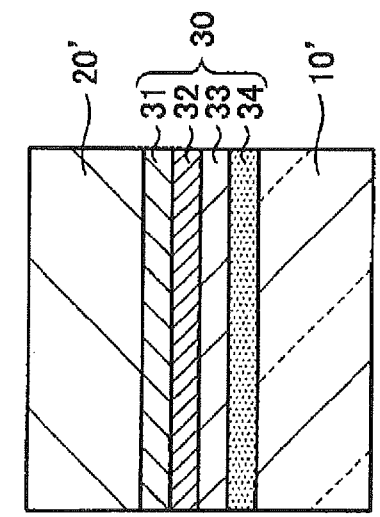
C
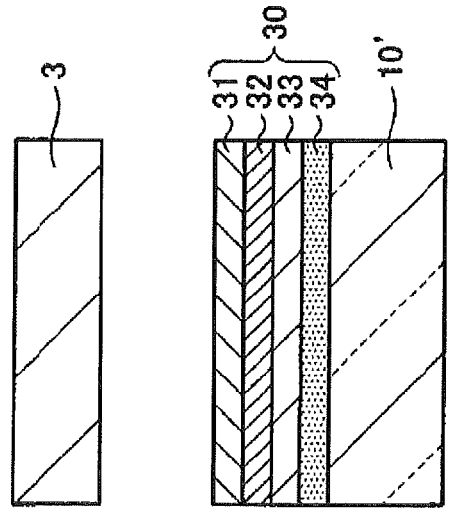
B
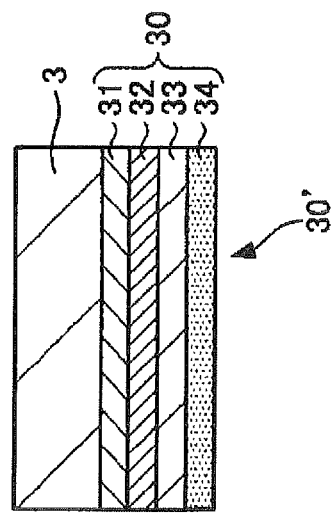
A
3 BASE FILM
10' PRIMARY MOLDING RESIN
20' SECONDARY MOLDING RESIN
30 TRANSFER LAYER
30' IN-MOLD TRANSFER FOIL
31 PRINT LAYER
32 CONDUCTIVE WIRE LAYER
33 DECORATING LAYER
34 BONDING LAYER FIG. 11
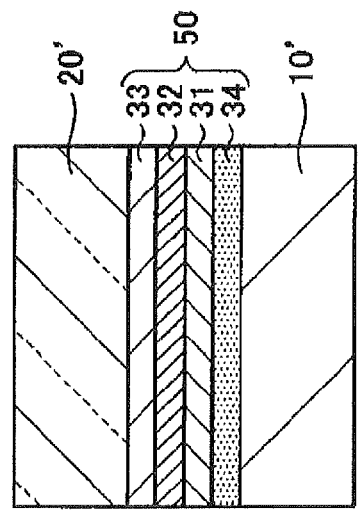
C
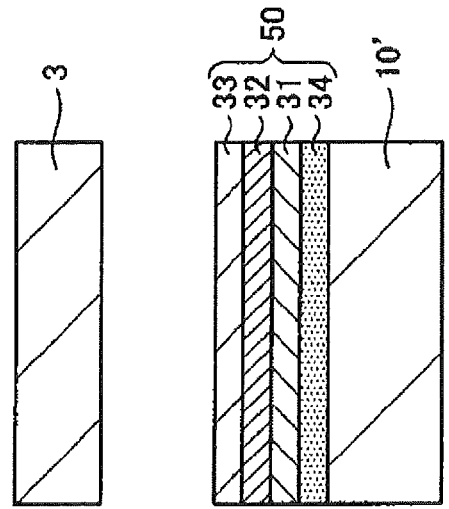
B
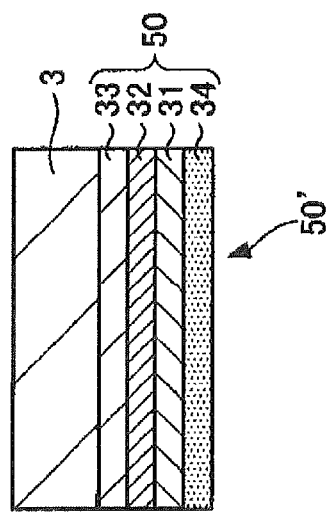
A
3 BASE FILM
10' PRIMARY MOLDING RESIN
20' SECONDARY MOLDING RESIN
31 PRINT LAYER
32 CONDUCTIVE WIRE LAYER
33 DECORATING LAYER
34 BONDING LAYER
50 TRANSFER LAYER
50' IN-MOLD TRANSFER FOIL FIG. 13
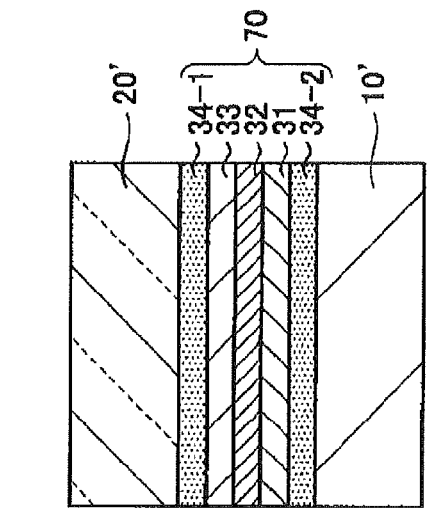
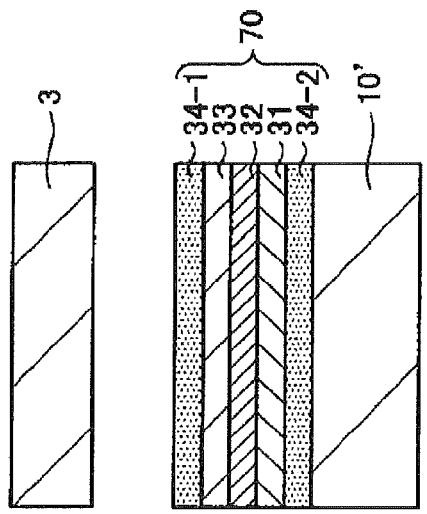
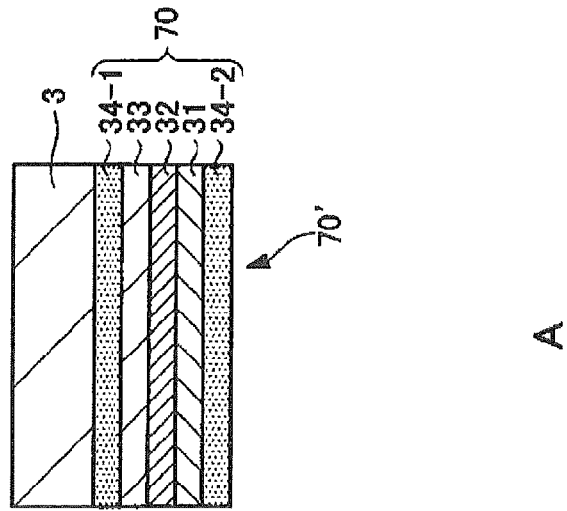
3 BASE FILM
10' PRIMARY MOLDING RESIN
20' SECONDARY MOLDING RESIN
31 PRINT LAYER
32 CONDUCTIVE WIRE LAYER
33 DECORATING LAYER
34-1 FIRST BONDING LAYER
34-2 SECOND BONDING LAYER
70 TRANSFER LAYER
70' IN-MOLD TRANSFER FOIL 3 BASE FILM
10' PRIMARY MOLDING RESIN
20' SECONDARY MOLDING RESIN
31 PRINT LAYER
32 CONDUCTIVE WIRE LAYER
33 DECORATING LAYER
34-1 FIRST BONDING LAYER
34-1a BONDING LAYER PROTRUDING PORTION
34-2 SECOND BONDING LAYER
90 TRANSFER LAYER
90' IN-MOLD TRANSFER FOIL

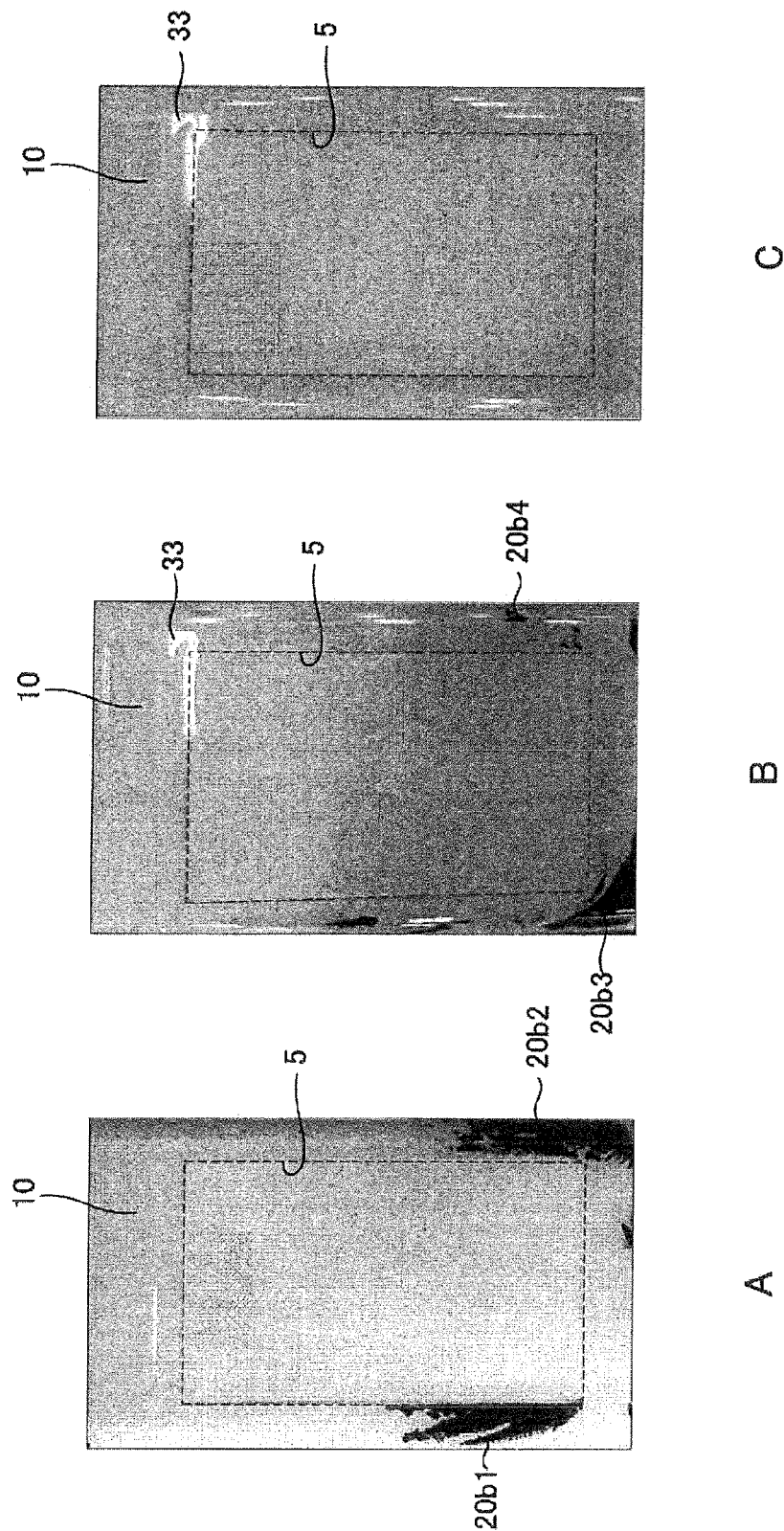

MOLDED PRODUCT AND IN-MOLD TRANSFER FOIL

CROSS REFERENCES TO RELATED APPLICATIONS

The present application is a national stage of International Application No. PCT/JP2012/063881 filed on May 30, 2012 and claims priority to Japanese Patent Application No. JP 2011-136792 filed on Jun. 20, 2011, and JP 2012-098692 filed on Apr. 24, 2012, the disclosure of which is incorporated herein by reference.

BACKGROUND

The present disclosure relates to a molded product integrally molded using, for example, different resin materials and in-mold transfer foil used for molding.

The following two-color molding method has been known. First, a cavity mold and a core mold for primary molding are clamped like sandwiching in-mold transfer foil in which the pattern layer or the like is formed therebetween and a molten primary molding resin is injected to mold a primary molded resin portion having the pattern layer transferred to the surface thereof. Then, the cavity mold mounted with the primary molding resin and a secondary molding core mold are clamped and a secondary molding resin is injected to mold a secondary molded resin portion like covering the surface of the primary molded resin portion (see, for example, Patent Literature 1). In a molded product produced by the two-color molding method, the pattern layer transferred from the in-mold transfer foil to the primary molded resin portion is advantageously protected by the secondary molded resin portion.

The in-mold transfer foil used for the above molding will be described below.

The in-mold transfer foil comprises a base film and a transfer layer formed on the base film. The transfer layer comprises a plurality of layers and has a laminated structure of, as an example, a hard coat layer, a decorating layer having a design or characters (pattern), and a bonding layer from the base film side. The in-mold transfer foil on which a pattern is printed is set into a molding die and the transfer layer of the in-mold transfer foil is transferred to the primary molding resin by pressure and heat of the injected molten resin. In this manner, the pattern printed on the in-mold transfer foil is transferred to a resin molding portion to achieve the molding and the surface decoration at the same time.

The decorating layer is a layer to attach design properties to molded products. The bonding layer is a layer to bond the transfer layer to a molded product and the adhesive strength manifests itself by being softened by heat of the injected molten resin. The decorating layer and the bonding layer are formed by, for example, silk-screen printing or gravure printing.

A hard coat layer is provided in most cases on the base film side of the decorating layer. The hard coat layer is a layer to protect the decorating layer from friction and scratches. The hard coat layer may be formed by a printing method, but in most cases is applied to the entire surface of the base film using, for example, a blade coater.

CITATION LIST

Patent Literature

Patent Literature JP 2011-11523A (FIGS. 3 to 5)

SUMMARY

Technical Problem

However, if the above two-color molding method is applied using conventional in-mold transfer foil, the transfer layer may be deformed or damaged due to the resin flowing at high pressure and high temperature during secondary molding. Deformation or damage of an ink layer printed on the base film as described above is called a foil flow or ink flow. Such deformation or damage may also be called a printing flow. If a foil flow of the decorating layer of the transfer layer occurs, it is difficult to execute a design as designed.

A conductive wire having a function of a circuit like an antenna or electrostatic switch can be formed in the transfer layer by, for example, printing conductive ink and if such a conductive wire is formed, the conductive wire may be shorted or broken when a foil flow occurs so that the circuit may not work as designed.

When in-mold transfer foil having a conventional hard coat layer formed on the base film side of the decorating layer is used, the hard coat layer is interposed between secondary molding resin and the decorating layer and thus, the resin flowing at high pressure and high temperature during secondary molding does not come into direct contact with the decorating layer, but a foil flow still occurs.

In general, acrylic resin or epoxy resin (these resins are frequently ultraviolet curing resins) having high hardness is used as the material of the hard coat layer, and these materials have high hardness, but at the same time are brittle (vulnerability). Thus, such a hard coat layer is suitable to prevent damage, but its function to prevent the print layer from being deformed or damaged by a resin at high pressure and high temperature (the pressure could rise to 100 MPa or more and the temperature to 200° C. or more) flowing during secondary molding cannot be said to be sufficient. The hard coat layer may be damaged by a flowing resin at high pressure and high temperature, leading to deformation of a pattern of the decorating layer below or a short or breaking of a conductive wire.

The present disclosure is developed in view of the above circumstances and prevents deformation or damage of the transfer layer of a molded product.

Solution to Problem

According to an embodiment of the present disclosure, there is provided a molded product including a primary molded layer, a transfer layer that includes at least a decorating layer and a print layer for foil flow prevention including one of polyester, polyurethane, polyimide and cellulose, or a mixture obtained by combining two or more of polyester, polyurethane, polyimide and cellulose as a main component, and is transferred to a surface of the primary molded layer, the decorating layer and the print layer for foil flow prevention being arranged in increasing order of distance from a side of the primary molded layer, and a secondary molded layer formed on the side of the print layer for foil flow prevention of the transfer layer.

According to a molded product of an aspect of the present disclosure, a foil flow prevention print layer using the above materials has higher toughness when compared with acrylic resin or epoxy resin used in a conventional hard coat layer. Therefore, even if a resin at high pressure and high temperature flows to the transfer layer during secondary molding, the foil flow prevention print layer is not damaged.

Advantageous Effects of Invention

According to the present disclosure, deformation or damage of the transfer layer of a molded product can be prevented.

Additional features and advantages are described herein, and will be apparent from the following Detailed Description and the figures.

BRIEF DESCRIPTION OF THE FIGURES

FIGS. 9A to 9C are explanatory views of a case of two-color molding by using in-mold transfer foil according to a first embodiment.

FIGS. 11A to 11C are explanatory views of a case of two-color molding by using in-mold transfer foil according to a third embodiment.

FIGS. 13A to 13C are explanatory views of a case of two-color molding by using in-mold transfer foil according to a fifth embodiment.

FIGS. 20A and 20B are explanatory views of examples of molded products in which a foil flow occurs and FIG. 20C is an explanatory view showing an example of a molded product using in-mold transfer foil according to the present disclosure.

DETAILED DESCRIPTION

Hereinafter, the embodiments the present disclosure will be described with reference to the appended drawings. The description will be provided in the order below. Note that elements common in each diagram are denoted with the same reference signs, and repeated explanation is omitted.

1. First Embodiment (example in which a print layer to prevent a foil flow is provided on the base film side of a decorating layer and a conductive wire layer: FIG. 9)

Figure 10:
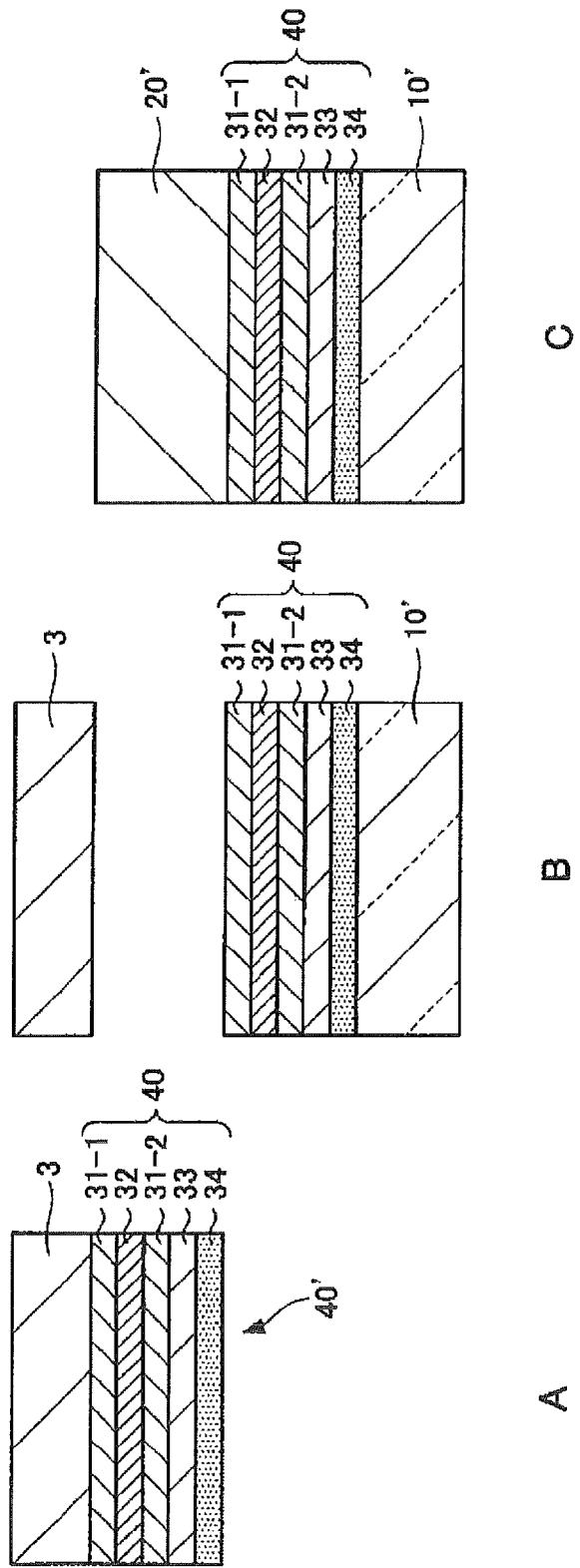
FIGS. 10A to 10C are explanatory views of a case of two-color molding by using in-mold transfer foil according to a second embodiment.

2. Second Embodiment (example in which upper and lower print layers sandwiching the conductive wire layer therebetween are provided: FIG. 10)

3. Third Embodiment (example in which the print layer to prevent a foil flow is provided on the base film side of the decorating layer and the conductive wire layer a secondary molded layer is transparent: FIG. 11)

Figure 12:
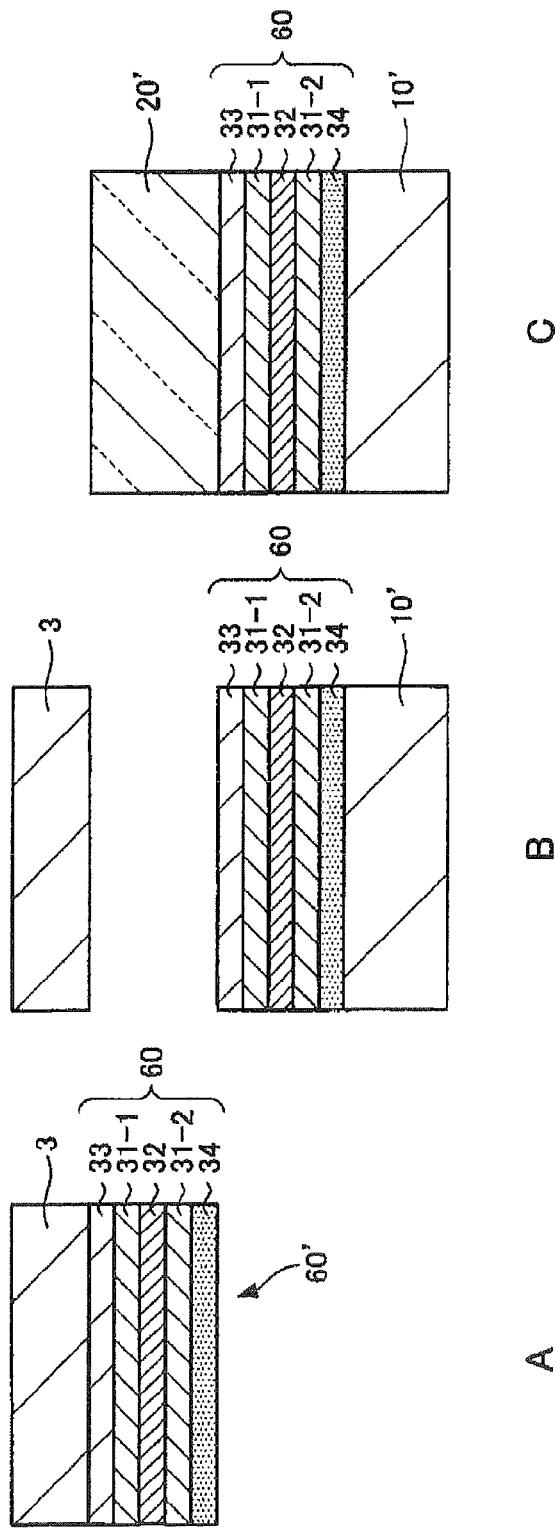
FIGS. 12A to 12C are explanatory views of a case of two-color molding by using in-mold transfer foil according to a fourth embodiment.

4. Fourth Embodiment (example in which upper and lower print layers sandwiching the conductive wire layer therebetween are provided and the secondary molded layer is transparent: FIG. 12)

5. Fifth Embodiment (example in which a bonding layer is provided on both sides of a primary molded layer and the secondary molded layer: FIG. 13)

Figure 14:
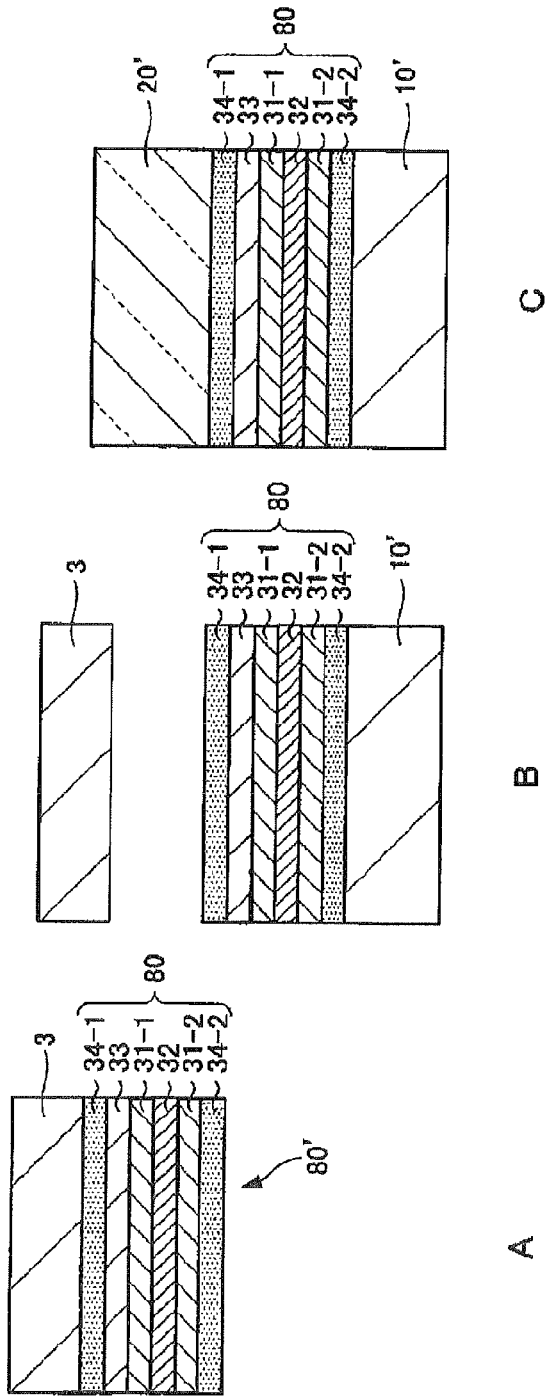
FIGS. 14A to 14C are explanatory views of a case of two-color molding by using in-mold transfer foil according to a sixth embodiment.

6. Sixth Embodiment (example in which upper and lower print layers sandwiching the conductive wire layer therebetween are provided and the bonding layer is provided on both sides of the primary molded layer and the secondary molded layer: FIG. 14)

Figure 15:
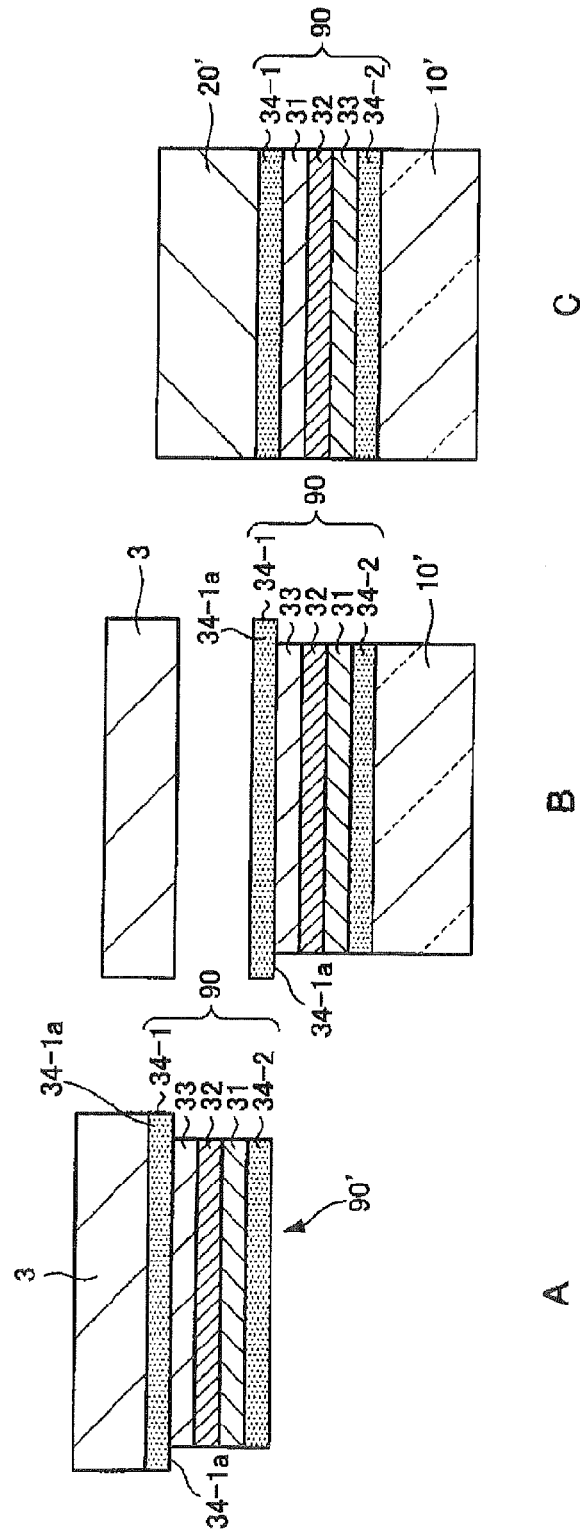
FIGS. 15A to 15C are explanatory views of a case of two-color molding by using in-mold transfer foil according to a seventh embodiment.
Figure 16:
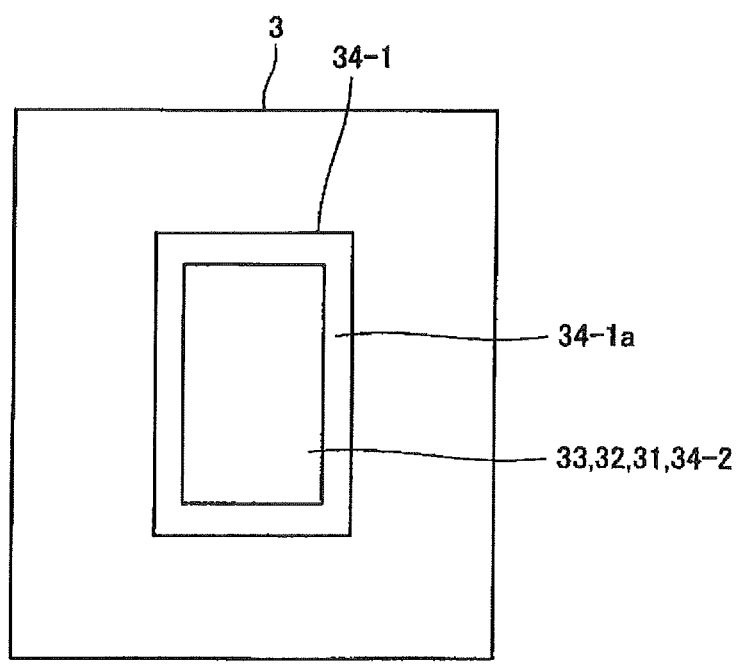
FIG. 16 is a plan view showing the in-mold transfer foil in FIG. 15A.

7. Seventh Embodiment (example in which the bonding layer protrudes: FIGS. 15, 16)

8. Examples and Comparative Examples

1. First Embodiment

Configuration of a Molded Product

Figure 1:
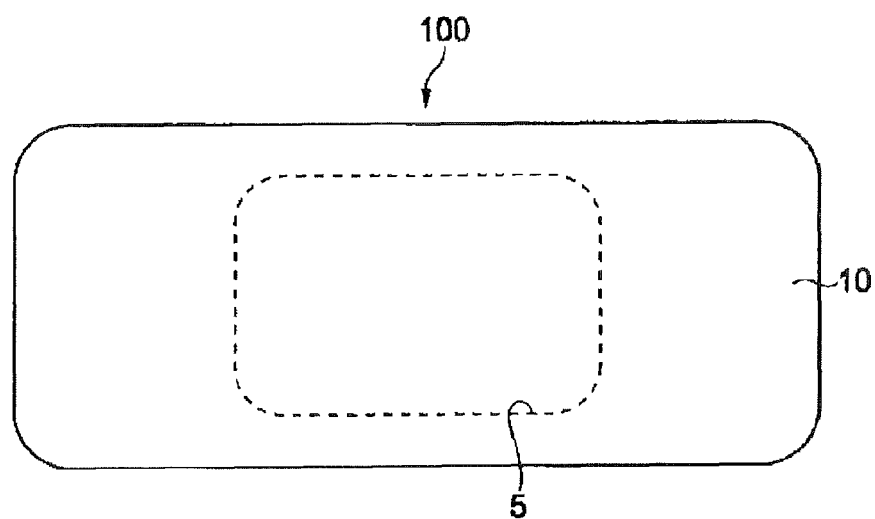
FIG. 1 is a plan view showing, as a molded product of a structure constituting a portion of an outwardly visible portion of an electronic device, a molded product of a front cover as a portion of a housing of the electronic device.

FIG. 1 is a plan view showing, as a molded product (two-color molded product) of a structure constituting a portion of an outwardly visible portion of an electronic device (not shown), a molded product of a front cover as a portion of a housing of the electronic device.

As the electronic device, for example, a mobile electronic device such as a mobile phone, mobile music player, and PDA (Personal Digital Assistant) can be cited. A front cover 100 is mounted on a main body (not shown) of a housing to constitute an electronic device.

Figure 2:
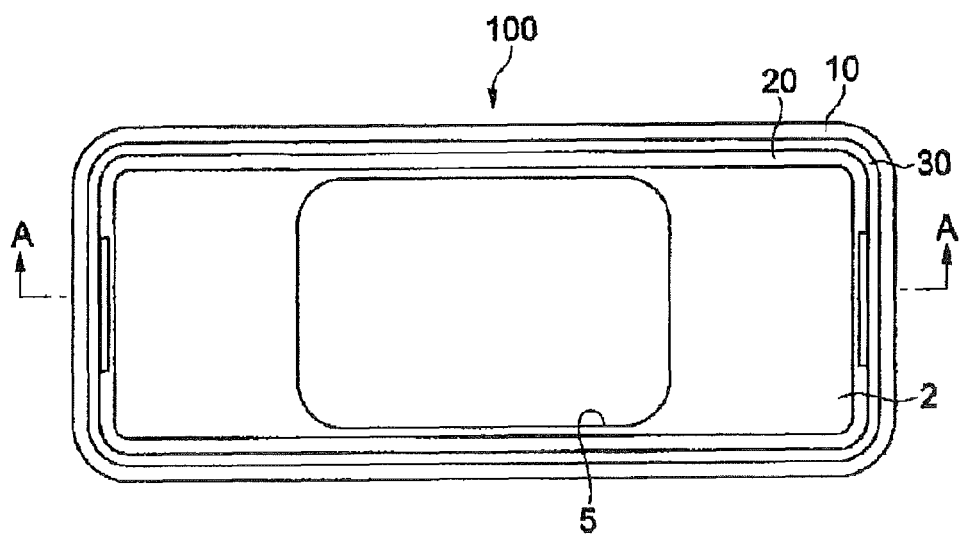
FIG. 2 is a plan view showing a back side (inner side of the housing) of the front cover shown in FIG. 1.
Figure 3:
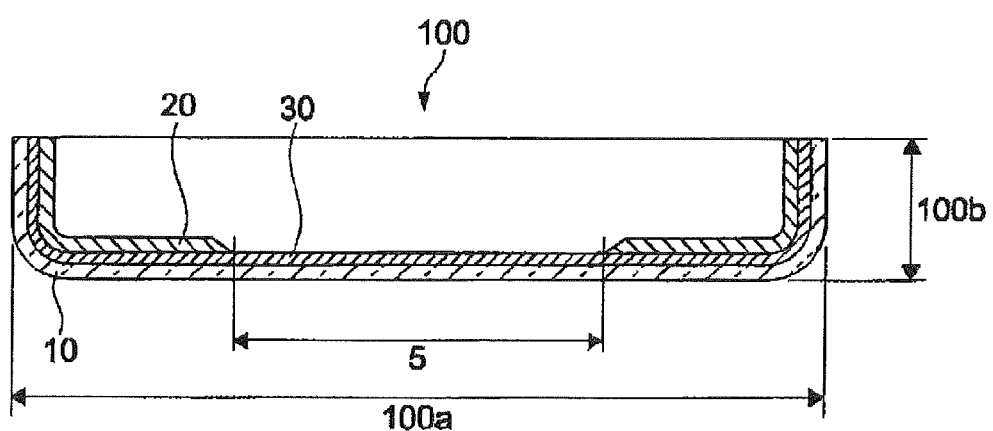
FIG. 3 is an A-A sectional view in FIG. 2.

FIG. 2 is a plan view showing a back side 2 (inner side of the housing) of the front cover 100. FIG. 3 is an A-A sectional view in FIG. 2.

As these drawings show, the front cover 100 includes a primary molded layer 10 forming a layer of the front cover 100, a secondary molded layer 20 forming a layer on the back side 2, and a transfer layer 30 sandwiched between these layers.

The primary molded layer 10 is a transparent or translucent resin to make a pattern of a decorating layer visible from the side of the primary molded layer. As the material of the primary molded layer 10, plastics of, for example, vinyl chloride, acrylic resin, general-purpose resin such as ABS resin, PC resin, and mixed resin of ABS resin and PC resin is used. The layer configuration of in-mold transfer foil containing the decorating layer will be described later.

The secondary molded layer 20 includes a boss structure (not shown) and a structure such as snap fitting or press fitting for clamping of the housing and the main body. As the material of the secondary molded layer 20, a resin, for example, the ABS resin whose mechanical strength is relatively high, PC resin, mixed resin of ABS resin and PC resin, PMMA (polymethyl methacrylate), and PS (polystyrene) is used.

The secondary molded layer 20 is formed on the back side 2 of the primary molded layer 10 so as to form a portion, in this example, a window portion 5 of the primary molded layer 10 of the front cover 100. The front cover 100 has a main surface 100a containing the window portion 5 and side face 100b provided approximately perpendicularly to the main surface 100a.

As will be described later, the transfer layer 30 transferred from in-mold transfer foil is arranged between the primary molded layer 10 and the secondary molded layer 20. In an electronic device, a panel (not shown) constituting a liquid crystal display or EL (Electro-Luminescence) display is arranged in the window portion 5 like facing from the back side 2 of the front cover 100. That is, the transfer layer 30 and the secondary molded layer 20 are formed so that a transparent portion as the window portion 5 remains in the transparent or translucent primary molded layer 10

The front cover 100 having the window portion 5 is taken as an example of a molded product of a structure constituting a portion of an outwardly visible portion of an electronic device, but the molded product is not limited to the above example and other configurations can naturally be taken.

Molding Method (Manufacturing Method) of a Molded Product

FIGS. 4 to 7 are diagrams illustrating the manufacturing method of the front cover 100 by in-mold molding.

Figure 4:
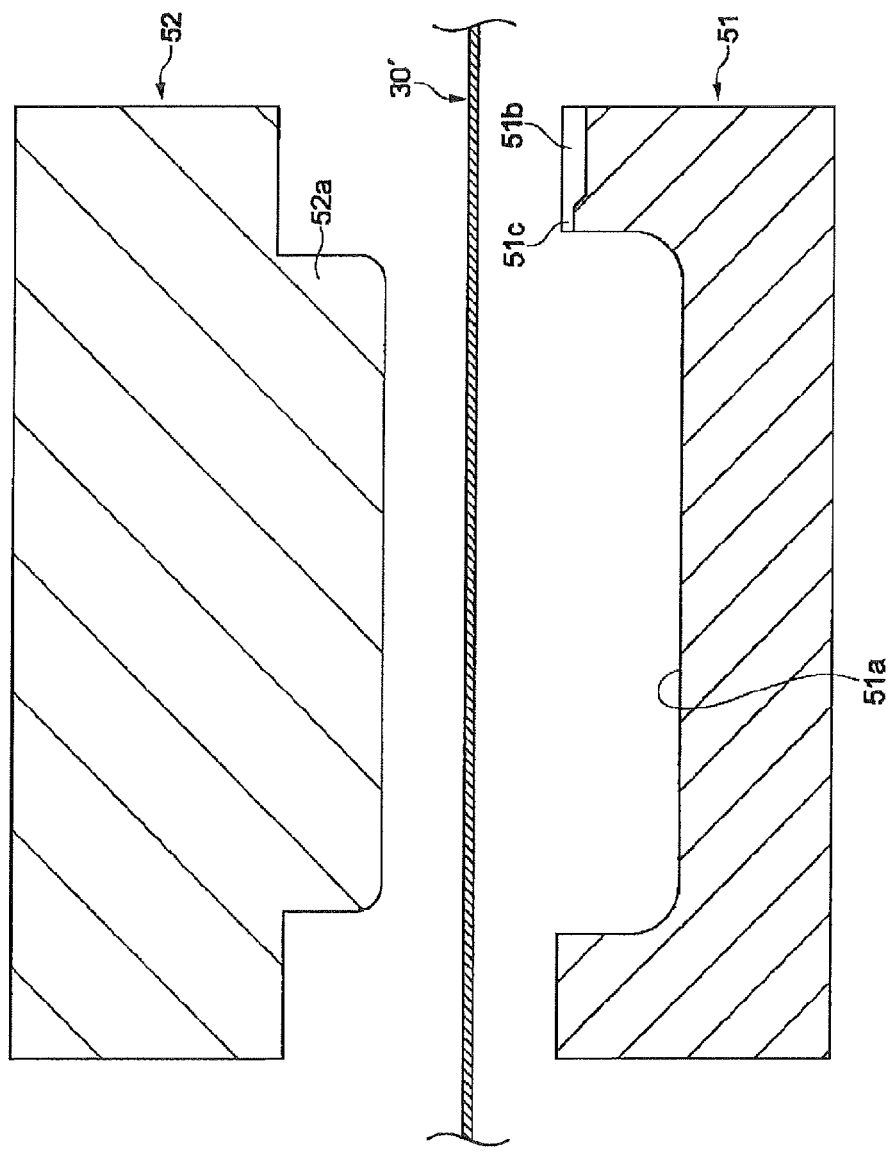
FIG. 4 is an explanatory view of a molding method of the front cover of the housing as a molded product and shows a state in which a cavity plate and a first core plate face
Figure 5:
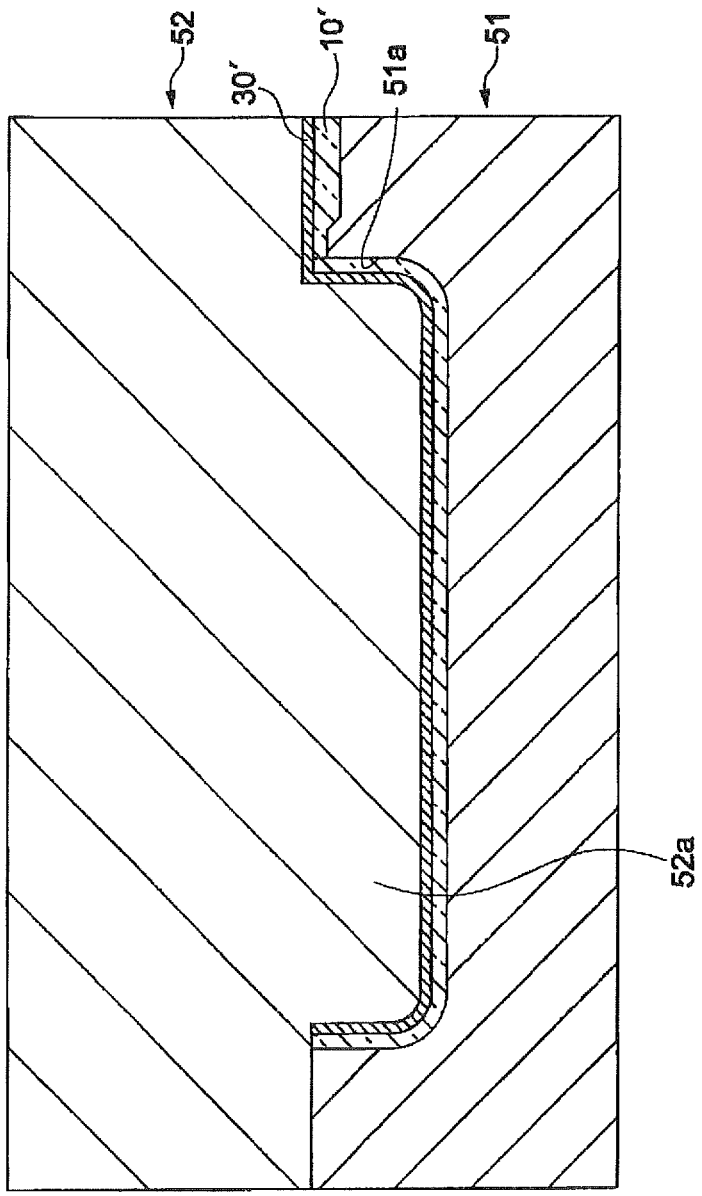
FIG. 5 is an explanatory view showing the state in which primary molding resin is filled after clamping is performed in the state shown in FIG. 4.

As the die to form the primary molded layer 10, as shown in FIG. 4, a cavity plate 51 having a cavity 51a and a first core plate 52 having a first core 52a are provided. Then, as shown in FIG. 5, the cavity 51a is filled with a primary molding resin 10' via a runner 51b and a gate 51c (see FIG. 4) provided in the cavity plate 51 and the first core 52a of the first core plate 52 is inserted into the cavity 51a to perform clamping. Predetermined temperature and pressure are applied to the primary molding resin 10' and fusion transfer of the transfer layer 30 formed on the surface of in-mold transfer foil 30' to the primary molding resin 10' is performed by the temperature and pressure of the resin.

Figure 6:
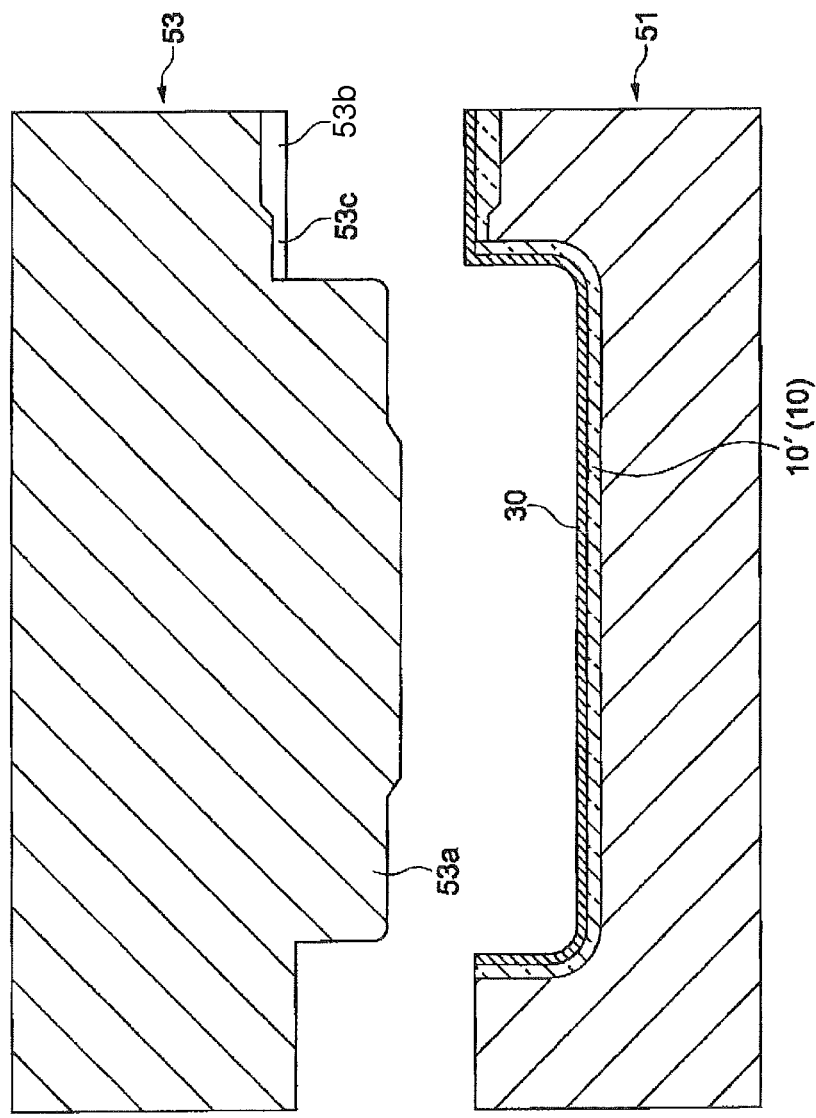
FIG. 6 is an explanatory view showing the state in which the cavity plate and a second core plate face.

Next, as the die to form the secondary molded layer 20, as shown in FIG. 6, the cavity plate 51 to which the primary molding resin 10' to which the transfer layer 30 is transferred is stuck and a second core plate 53 having a second core 53a are provided. Typically, the first core plate 52 and the second core plate 53 are integrally provided and the first core 52a and the second core 53a are formed in one plate. Then, after the primary molded layer 10 is formed by the first core 52a, the core plate is rotated so that the second core 53a and the cavity 51a of the cavity plate 51 face each other.

Figure 7:
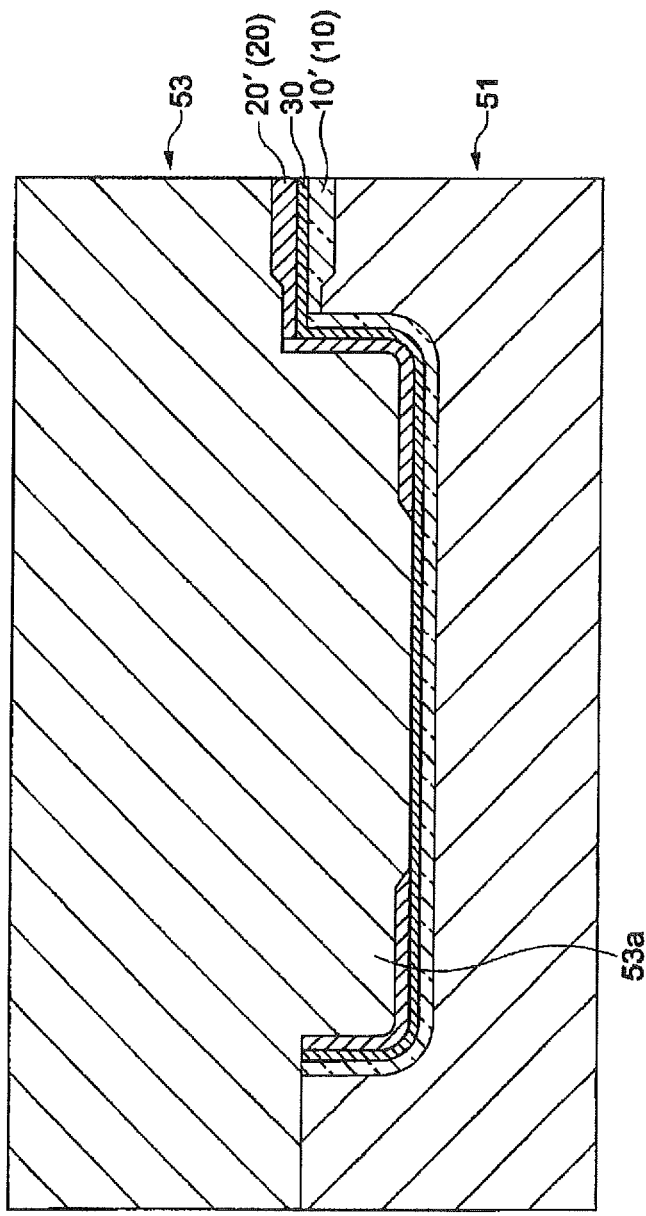
FIG. 7 is a diagram showing the state after clamping is performed in the state shown in FIG. 6.

As shown in FIG. 7, the cavity 51a of the cavity plate 51 is filled with a secondary molding resin 20' via a runner 53b and a gate 53c (see FIG. 6) provided in the second core plate 53 and the second core 53a of the second core plate 53 is inserted into the cavity 51a to perform clamping. Predetermined temperature and pressure are applied to the secondary molding resin 20'.

Then, the mold is released. That is, a molded product is removed from the die. Accordingly, molding of a molded product is completed.

In a molded product according to the present embodiment, as described above, the transfer layer 30 (a conductive wire layer, decorating layer or the like described later) as a portion of the in-mold transfer foil 30' is sandwiched between the primary molded layer 10 and the secondary molded layer 20. In a portion of the molded product, so to say, the primary molded layer 10 and the secondary molded layer 20 fulfill a function like packaging of semiconductor circuit chips. Accordingly, the transfer layer 30 can be held between the primary molded layer 10 and the secondary molded layer 20.

Particularly, the decorating layer or the conductive wire layer is arranged between the primary molded layer 10 and the secondary molded layer 20. Accordingly, the decorating layer or the conductive wire layer can be prevented from being damaged or inhibition of electric conduction after adhesion of dust or the like to the conductive wire layer can be prevented.

Description of a Case of Two-Color Molding by Providing a Conductive Wire Layer in General In-Mold Transfer Foil It is assumed that an electric function is attached to a mold product to which the multi-color molding method is applied by providing a conductive wire layer in the transfer layer of in-mold transfer foil. Concrete electric functions include an antenna, electrostatic switch, touch sensor, and wire. An example of the conductive wire layer is described in JP 3118276B1 and the like and the conductive wire layer described in the patent gazette relates to molding of single resin and is not related to a two-color molded product.

Figure 8:
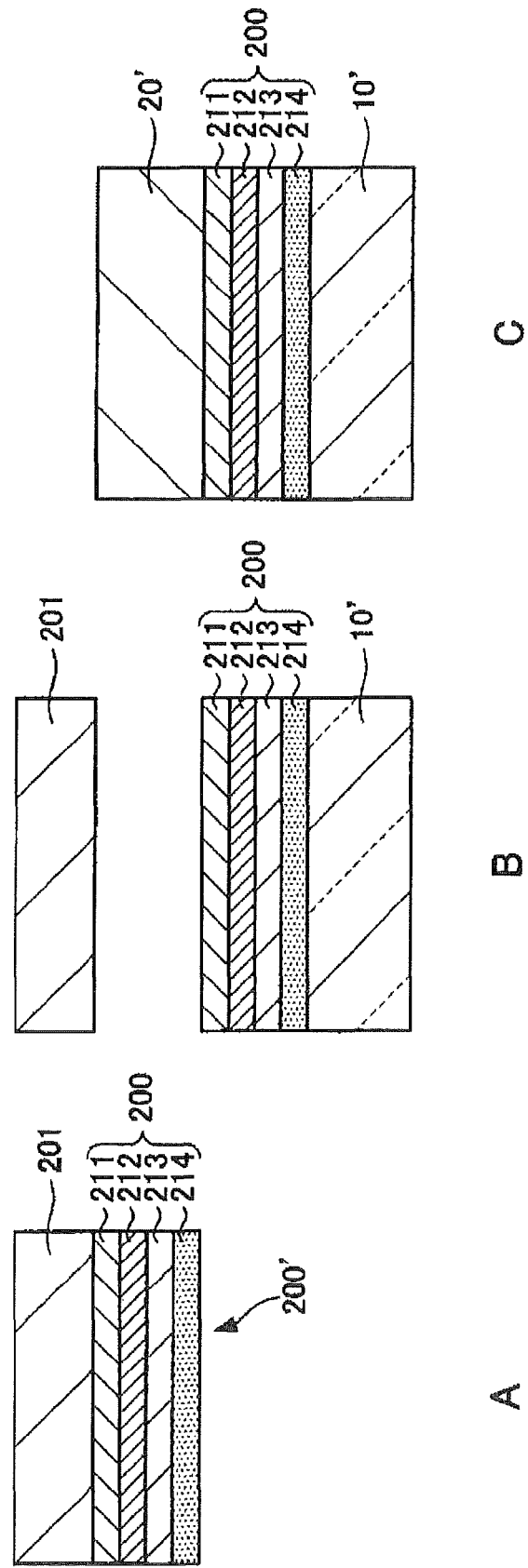
FIGS. 8A to 8C are explanatory views of a case of two-color molding by providing a conductive wire layer in general in-mold transfer foil.

FIG. 8 shows explanatory views of a case of two-color molding by providing a conductive wire layer in general in-mold transfer foil FIG. 8A shows a structure of the in-mold transfer foil, FIG. 8B shows a state in which the transfer layer of the in-mold transfer foil is transferred to the primary molding resin, and FIG. 8C further shows a state in which a two-color molded product is produced by molding a secondary molding resin.

In-mold transfer foil 200' comprises a base film 201 having fixed mold release characteristics and a transfer layer 200 formed on the base film 201. The transfer layer 200 has a laminated structure of a hard coat layer 211, a conductive wire layer 212, a decorating layer 213, and a bonding layer 214 in this order from the side of the base film 201 (FIG. 8A). The transfer layer 200 of the in-mold transfer foil 200' is transferred to the primary molding resin 10' by the primary molding (FIG. 8B) and then, a secondary molded product is obtained by performing the secondary molding using the secondary molding resin 20' from over the hard coat layer 211 of the primary molded product (FIG. 8C). The hard coat layer 211 is provided for the decorating layer 213 on the lower side (base film 201 side) of the decorating layer 213.

As described above, acrylic resin or epoxy resin is frequently having high hardness is used as the material of a hard coat layer provided in general transfer foil. If, in two-color molding, the hard coat layer is damaged by a resin flowing at high pressure and high temperature during secondary molding, layers below (here, the pattern of the decorating layer 213 or the wiring pattern of the conductive wire layer 212) may be deformed or damaged. Particularly if the wiring pattern of the conductive wire layer is broken or shorted, the electric function of a two-color molded product fails. Therefore, preventing the transferred layer from being deformed or damaged by a resin flowing at high pressure and high temperature during secondary molding is demanded.

Description of Color Molding Using In-Mold Transfer Foil Having a Conductive Wire Layer According to the Present Disclosure A case of two-color molding by using in-mold transfer foil according to the first embodiment will be described.

The present embodiment is an example in which a print layer (example of the print layer for foil flow prevention) of a predetermined resin is provided on the base film side of the decorating layer and the conductive wire layer of in-mold transfer foil to prevent deformation/damage of the layer transferred to a primary molded product in secondary molding.

FIG. 9 shows explanatory views when two-color molding is performed using in-mold transfer foil according to the first embodiment, FIG. 9A shows a structure of the in-mold transfer foil. FIG. 9B shows a state in which the transfer layer of the in-mold transfer foil is transferred to the primary molding resin, and FIG. 9C further shows a state in which a two-color molded product is produced by molding the secondary molding resin.

The in-mold transfer foil 30' comprises a base film 3 and the transfer layer 30 formed on the base film 3. The transfer layer 30 has a laminated structure of a print layer 31, a conductive wire layer 32, a decorating layer 33, and a bonding layer 34 in this order from the side of the base film 3 (FIG. 9A). The transfer layer 30 of the in-mold transfer foil 30' is transferred to the primary molding resin 10' by the primary molding (FIG. 9B) and then, a two-color molded product is obtained by performing the secondary molding using the secondary molding resin 20' from over the print layer 31 of the primary molded product (FIG. 9C).

As the material of the base film 3, a resin such as polyethylene terephthalate and polypropylene is used.

The conductive wire layer 32 is a layer of conductive material patterned to a circuit shape to realize a desired electric function and may be formed by pattern printing of a conductive paste such as a silver paste and a carbon paste or by patterning after vapor deposition of a thin metal film.

The conductive wire has one layer or two layers or more to form a circuit like a multi-layer board of a printed board. When two layers or more are formed, like a multi-layer board, an insulating layer is arranged between layers and when it is necessary to connect a circuit in some layer to a circuit in another layer, a through hole is provided in an appropriate location of the insulating layer and the through hole is filled with a conductive material to connect the circuit.

The decorating layer 33 is a layer to attach design properties to the housing and is formed by, for example, silk-screen printing or gravure printing. The decorating layer may have one layer or two or more layers. When two or more decorating layers are formed, for example, a form in which one layer is used for groundwork design and other layers are used for design of characters or figures on the groundwork can be considered.

As the material of the bonding layer 34, the optimum material needs to be selected depending on the material of the resin to be bonded and, for example, vinyl chloride-vinyl acetate copolymer (abbreviation of a copolymer of vinyl chloride and vinyl acetate), acrylic, polyester, and polycarbonate can be cited. The bonding layer 34 is melted by high pressure and high temperature during molding and mixed with the surface of the primary molding resin 10' or is penetrated from the surface of the primary molding resin 10' during molding and mixed with the primary molding resin 10' to bond the transfer layer 30 and the primary molding resin 10'.

In the present embodiment, the print layer 31 is formed on the lower side (base film 3 side) of the decorating layer 33 and the conductive wire layer 32. One of polyester, polyurethane, polyimide, and cellulose or a material having a mixture combining two or more of these materials as a main component is used for the print layer 31. When compared with acrylic resin or epoxy resin used for a conventional hard coat layer, the print layer 31 of these materials has lower hardness, but high toughness (not brittle), Thus, even if a resin at high pressure and high temperature flows during secondary molding, the print layer 31 is not damaged and the decorating layer 33 and the conductive wire layer 32 can be prevented from being deformed or damaged. To form the print layer 31 as a film of high toughness, it is suitable to use two-component curing ink of the above materials.

It is necessary to set the thickness of the print layer 31 to 2 μm to 40 μm and preferably to 5 μm to 20 μm. If the thickness is too small, the effect of preventing a foil flow becomes insufficient and thus, there is the possibility of an occurrence of cracks due to drying shrinkage during drying after printing or an occurrence of cracks when transferred to a curved shape portion.

The print layer 31 only needs to contain at least the above materials or a mixture combining these materials as a main component and may further contain a filler or pigment. As the filler, for example, particles of silicon oxide or resin beads (for example, urethane beads) can be used. With a filler contained in the print layer 31, pin holes are less likely to occur in the print layer 31 and yields of two-color molding are increased, By causing the print layer 31 to contain a pigment, the print layer 31 can also be used for decoration (design).

In in-mold transfer foil and a molded product in the present embodiment, it is only necessary that at least the bonding layer 34, the decorating layer 33, and the print layer 31 be included in increasing order of distance from the side of the primary molded layer and the lamination order of the bonding layer 34, the decorating layer 33, and the print layer 31 be obeyed. That is, as long as the lamination order of these layers is obeyed, these layers may not be adjacent to each other. For example, as shown in FIG. 9, a similar effect can be obtained if another layer such as the conductive wire layer 32 or a transparent resin layer is formed between the decorating layer 33 and the print layer 31.

To increase the bonding strength between a secondary molded layer and a primary molded layer, a bonding layer to the secondary molding resin may be provided on the side of the secondary molded layer of the print layer 31 (base film side in the in-mold transfer foil). As the material of the bonding layer, like the material of the bonding layer 34, the optimum material needs to be selected depending on the material of the resin to be bonded and, for example, vinyl chloride-vinyl acetate copolymer (abbreviation of a copolymer of vinyl chloride and vinyl acetate), acrylic, polyester, and polycarbonate can be cited. When vinyl chloride-vinyl acetate copolymer is used, however, adhesiveness between the base film and the transfer layer may be too strong.

In the present embodiment, an example of the in-mold transfer foil 30' having the conductive wire layer 32 is described, but when no electric function is attached to the molded product, the print layer 31 may be applied to in-mold transfer foil without the conductive wire layer 32.

2. Second Embodiment

Next, a case of two-color molding by using in-mold transfer foil according to the second embodiment will be described. The present embodiment is an example in which the print layers 31 as upper and lower print layers sandwiching the conductive wire layer therebetween are provided.

FIG. 10 shows explanatory views when two-color molding is performed using in-mold transfer foil according to the second embodiment, FIG. 10A shows a structure of the in-mold transfer foil, FIG. 10B shows a state in which the transfer layer of the in-mold transfer foil is transferred to the primary molding resin, and FIG. 10C further shows a state in which a two-color molded product is produced by molding the secondary molding resin.

In-mold transfer foil 40' comprises the base film 3 and a transfer layer 40 formed on the base film 3. The transfer layer 40 has a laminated structure of a first print layer 31-1, the conductive wire layer 32, a second print layer 31-2, the decorating layer 33, and the bonding layer 34 in this order from the side of the base film 3 (FIG. 10A). The transfer layer 40 of the in-mold transfer foil 40' is transferred to the primary molding resin 10' by the primary molding (FIG. 10B) and then, a two-color molded product is obtained by performing the secondary molding using the secondary molding resin 20' from over the first print layer 31-1 of the primary molded product (FIG. 10C).

Sandwiching the conductive wire layer by providing the print layers 31 (the first print layer 31-1 and the second print layer 31-2) on the upper and lower sides, rather than only on the lower side of the conductive wire layer (base film 3 side), is preferable from the viewpoint of preventing deformation and damage.

Also in the second embodiment, like in the first embodiment, for the purpose of increasing the bonding strength between a secondary molded layer and a primary molded layer, a bonding layer to the secondary molding resin may be provided on the side of the secondary molded layer of the first print layer 31-1 (base film side in the in-mold transfer foil). As the material of the bonding layer, the optimum material needs to be selected depending on the material of the resin to be bonded and, for example, vinyl chloride-vinyl acetate copolymer (abbreviation of a copolymer of vinyl chloride and vinyl acetate), acrylic, polyester, and polycarbonate can be cited. When vinyl chloride-vinyl acetate copolymer is used, however, adhesiveness between the base film and the transfer layer may be too strong.

Also like in the first embodiment, the decorating layer and the conductive wire layer may have one layer or two or more layers.

3. Third Embodiment

Next, a case of two-color molding by using in-mold transfer foil according to the third embodiment will be described. In the present embodiment, an opaque resin is used for the primary molded layer 10 and a transparent or translucent resin is used for the secondary molded layer 20. The materials of the secondary molded layer 20 described in the first embodiment are used as the material of the primary molded layer 10 as an opaque resin. As the material of the primary molded layer 10, a resin, for example, the ABS resin whose mechanical strength is relatively high, PC resin, mixed resin of ABS resin and PC resin, PMMA (poly-methyl methacrylate), and PS (polystyrene) is used. The materials of the secondary molded layer 20 described in the first embodiment are used as the material of the secondary molded layer 20 as a transparent or translucent resin. As the material of the secondary molded layer 20, plastics of, for example, vinyl chloride, acrylic resin, general-purpose resin such as ABS resin, PC resin, and mixed resin of ABS resin and PC resin is used.

Each layer and the base film described in the other embodiments can be applied as each layer and the base film constituting in-mold transfer foil 50' according to the third embodiment and thus, concrete material names, functions, and thickness of each layer are omitted.

FIG. 11 is an explanatory view of a case of two-color molding by using in-mold transfer foil according to the third embodiment. FIG. 11A shows a structure of the in-mold transfer foil, FIG. 11B shows a state in which the transfer layer of the in-mold transfer foil is transferred to the primary molding resin, and FIG. 11C further shows a state in which a two-color molded product is produced by molding the secondary molding resin.

The in-mold transfer foil 50' comprises the base film 3 and a transfer layer 50 formed on the base film 3. The transfer layer 50 has a laminated structure of the decorating layer 33, the conductive wire layer 32, the print layer 31, and a bonding layer 34 in this order from the side of the base film 3 (FIG. 11A). The transfer layer 50 of the in-mold transfer foil 50' is transferred to the primary molding resin 10' by the primary molding (FIG. 11B) and then, a two-color molded product is obtained by performing the secondary molding using the secondary molding resin 20' from over the decorating layer 33 of the primary molded product (FIG. 11C).

In the present embodiment, the print layer 31 is formed on the upper side (first molded layer side) of the decorating layer 33 and the conductive wire layer 32.

In in-mold transfer foil and a molded product in the present embodiment, it is only necessary that at least the bonding layer 34, the print layer 31, and the decorating layer 33 be included in increasing order of distance from the side of the primary molded layer and the lamination order of the bonding layer 34, the print layer 31, and the decorating layer 33 be obeyed. That is, as long as the lamination order of these layers is obeyed, these layers may not be adjacent to each other. For example, as shown in FIG. 11, a similar effect can be obtained if another layer such as the conductive wire layer 32 or a transparent resin layer is formed between the print layer 31 and the decorating layer 33.

In the present embodiment, an example of the in-mold transfer foil 50' having the conductive wire layer 32 is described, but when no electric function is attached to the molded product, the print layer 31 may be applied to in-mold transfer foil without the conductive wire layer 32.

4. Fourth Embodiment

Next, a case of two-color molding by using in-mold transfer foil according to the fourth embodiment will be described. In the present embodiment, an opaque resin is used for the primary molded layer 10 and a transparent or translucent resin is used for the secondary molded layer 20 and also the print layers 31 as upper and lower print layers sandwiching the conductive wire layer therebetween are provided.

As the material of the primary molded layer 10, which is an opaque resin, and as the material of the secondary molded layer 20, which is a transparent or translucent resin, those materials described in the third embodiment are used.

Each layer and the base film described in the other embodiments can be applied as each layer and the base film constituting in-mold transfer foil 60' according to the fourth embodiment and thus, concrete material names, functions, and thickness of each layer are omitted.

FIG. 12 shows explanatory views when two-color molding is performed using in-mold transfer foil according to the fourth embodiment, FIG. 12A shows a structure of the in-mold transfer foil, FIG. 123 shows a state in which the transfer layer of the in-mold transfer foil is transferred to the primary molding resin, and FIG. 12C further shows a state in which a two-color molded product is produced by molding the secondary molding resin.

The in-mold transfer foil 60' comprises the base film 3 and a transfer layer 60 formed on the base film 3. The transfer layer 60 has a laminated structure of the decorating layer 33, the first print layer 31-1, the conductive wire layer 32, the second print layer 31-2, and the bonding layer 34 in this order from the side of the base film 3 (FIG. 12A). The transfer layer 60 of the in-mold transfer foil 60' is transferred to the primary molding resin 10' by the primary molding (FIG. 12B) and then, a two-color molded product is obtained by performing the secondary molding using the secondary molding resin 20' from over the decorating layer 33 of the primary molded product (FIG. 12C).

Sandwiching the conductive wire layer by providing the print layers 31 (the first print layer 31-1 and the second print layer 31-2) on the upper and lower sides, rather than only on the lower side of the conductive wire layer (base film 3 side), is preferable from the viewpoint of preventing deformation and damage.

Also in the fourth embodiment, like in the other embodiments, the decorating layer and the conductive wire layer may have one layer or two or more layers. When no electric function is attached to a molded product, the conductive wire layer 32 may be omitted.

5. Fifth Embodiment

Next, a case of secondary molding by using in-mold transfer foil according to the fifth embodiment will be described. In the present embodiment, to further increase the bonding strength between a secondary molded layer and a primary molded layer, a bonding layer to the secondary molding resin is provided on the side of the secondary molded layer of the decorating layer 33 (base film side in the in-mold transfer foil) in in-mold transfer foil according to the third embodiment.

In the present embodiment, an opaque resin is used for the primary molded layer 10 and a transparent or translucent resin is used for the secondary molded layer 20. As the material of the primary molded layer 10, which is an opaque resin, and as the material of the secondary molded layer 20, which is a transparent or translucent resin, those materials described in the third embodiment are used.

Each layer and the base film described in the other embodiments can be applied as each layer and the base film constituting in-mold transfer foil 70' according to the fifth embodiment and thus, concrete material names, functions, and thickness of each layer are omitted.

FIG. 13 shows explanatory views when two-color molding is performed using in-mold transfer foil according to the fifth embodiment, FIG. 13A shows a structure of the in-mold transfer foil, FIG. 13B shows a state in which the transfer layer of the in-mold transfer foil is transferred to the primary molding resin, and FIG. 13C further shows a state in which a two-color molded product is produced by molding the secondary molding resin.

The in-mold transfer foil 70' comprises the base film 3 and a transfer layer 70 formed on the base film 3. The transfer layer 70 has a laminated structure of a first bonding layer 34-1, the decorating layer 33, the conductive wire layer 32, the print layer 31, and a second bonding layer 34-2 in this order from the side of the base film 3 (FIG. 13A). The transfer layer 70 of the in-mold transfer foil 70' is transferred to the primary molding resin 10' by the primary molding (FIG. 13B) and then, a two-color molded product is obtained by performing the secondary molding using the secondary molding resin 20' from over the first bonding layer 34-1 of the primary molded product (FIG. 13C).

In the present embodiment, the print layer 31 is formed on the upper side (first molded layer side) of the decorating layer 33 and the conductive wire layer 32, In in-mold transfer foil and a molded product in the present embodiment, it is only necessary that at least the second bonding layer 34-2, the print layer 31, the decorating layer 33, and the first bonding layer 34-1 be included in increasing order of distance from the side of the primary molded layer and the lamination order of the second bonding layer 34-2, the print layer 31, the decorating layer 33, and the first bonding layer 34-1 be obeyed. That is, as long as the lamination order of these layers is obeyed, these layers may not be adjacent to each other. For example, as shown in FIG. 13, a similar effect can be obtained if another layer such as the conductive wire layer 32 or a transparent resin layer is formed between the print layer 31 and the decorating layer 33.

Thus, by using the transfer layer 70 having the two bonding layers 34-1, 34-2 for molding, the bonding strength between a secondary molded layer and a primary molded layer can be increased. As the material of the first bonding layer 34-1, like the material of the second bonding layer 34-2 (bonding layer 34 in the first embodiment), the optimum material needs to be selected depending on the material of the resin to be bonded. For example, vinyl chloride-vinyl acetate copolymer (abbreviation of a copolymer of vinyl chloride and vinyl acetate), acrylic, polyester, and polycarbonate can be cited. When vinyl chloride-vinyl acetate copolymer is used, however, adhesiveness between the base film and the transfer layer may be too strong.

Also in the fifth embodiment, like in the other embodiments, the decorating layer and the conductive wire layer may have one layer or two or more layers. When no electric function is attached to a molded product, the conductive wire layer 32 may be omitted.

6. Sixth Embodiment

Next, a case of two-color molding by using in-mold transfer foil according to the sixth embodiment will be described. In the present embodiment, to further increase the bonding strength between a secondary molded layer and a primary molded layer, a bonding layer to the secondary molding resin is provided on the side of the secondary molded layer of the first print layer 31-1 (base film side in the in-mold transfer foil) in in-mold transfer foil according to the fourth embodiment.

In the present embodiment, an opaque resin is used for the primary molded layer 10 and a transparent or translucent resin is used for the secondary molded layer 20. As the material of the primary-molded layer 10, which is an opaque resin, and as the material of the secondary molded layer 20, which is a transparent or translucent resin, those materials described in the third embodiment are used.

Each layer and the base film described in the other embodiments can be applied as each layer and the base film constituting in-mold transfer foil 80' according to the sixth embodiment and thus, concrete material names, functions, and thickness of each layer are omitted.

FIG. 14 shows explanatory views when two-color molding is performed using in-mold transfer foil according to the sixth embodiment, FIG. 14A shows a structure of the in-mold transfer foil. FIG. 14B shows a state in which the transfer layer of the in-mold transfer foil is transferred to the primary molding resin, and FIG. 14C further shows a state in which a two-color molded product is produced by molding the secondary molding resin.

The in-mold transfer foil 80' comprises the base film 3 and a transfer layer 80 formed on the base film 3. The transfer layer 80 has a laminated structure of the first bonding layer 34-1, the decorating layer 33, the first print layer 31-1, the conductive wire layer 32, the second print layer 31-2, and the second bonding layer 34-2 in this order from the side of the base film 3 (FIG. 14A), The transfer layer 80 of the in-mold transfer foil 80' is transferred to the primary molding resin 10' by the primary molding (FIG. 14B) and then, a two-color molded product is obtained by performing the secondary molding using the secondary molding resin 20' from over the first bonding layer 34-1 of the primary molded product (FIG. 14C).

Thus, by using the transfer layer 80 having the two bonding layers 34-1, 34-2 for molding, the bonding strength between a secondary molded layer and a primary molded layer can be increased.

Also in the sixth embodiment, like in the other embodiments, the decorating layer and the conductive wire layer may have one layer or two or more layers. When no electric function is attached to a molded product, the conductive wire layer 32 may be omitted.

7. Seventh Embodiment

Next, a case of two-color molding by using in-mold transfer foil according to the seventh embodiment will be described. The present embodiment has the same layer configuration as in-mold transfer foil according to the fifth embodiment and, in addition, has an outer shape in which the first bonding layer 34-1 protrudes from other layers.

In the present embodiment, an opaque resin is used for the primary molded layer 10 and a transparent or translucent resin is used for the secondary molded layer 20. As the material of the primary molded layer 10, which is an opaque resin, and as the material of the secondary molded layer 20, which is a transparent or translucent resin, those materials described in the third embodiment are used.

Each layer and the base film described in the other embodiments can be applied as each layer and the base film constituting in-mold transfer foil 90' according to the seventh embodiment and thus, concrete material names, functions, and thickness of each layer are omitted.

FIG. 15 shows explanatory views when two-color molding is performed using in-mold transfer foil according to the seventh embodiment, FIG. 15A shows a structure of the in-mold transfer foil, FIG. 15B shows a state in which the transfer layer of the in-mold transfer foil is transferred to the primary molding resin, and FIG. 15C further shows a state in which a two-color molded product is produced by molding the secondary molding resin.

The in-mold transfer foil 90 comprises the base film 3 and a transfer layer 90 formed on the base film 3. The transfer layer 90 has, like the transfer layer 70 shown in FIG. 13, a laminated structure of the first bonding layer 34-1, the decorating layer 33, the conductive wire layer 32, the print layer 31, and the second bonding layer 34-2 in this order from the side of the base film 3 (FIG. 15A). The transfer layer 90 of the in-mold transfer foil 90' is transferred to the primary molding resin 10' by the primary molding (FIG. 15B) and then, a two-color molded product is obtained by performing the secondary molding using the secondary molding resin 20' from over the first bonding layer 34-1 of the primary molded product (FIG. 15C).

In the present embodiment, as shown in FIG. ISA, a protruding portion 34-1a is provided in the first bonding layer 34-1 in contact with the base film 3 by making the outer shape thereof larger than those of the other layers 31, 32, 33, 34-2. Other portions of the in-mold transfer foil 90' are the same as those of the in-mold transfer foil 70' in the fifth embodiment.

FIG. 16 is a plan view showing the in-mold transfer foil 90' shown in FIG. 15A. As shown in FIG. 16, the first bonding layer 34-1 in contact with the base film 3 has the protruding portion 34-1a in the entire circumference of the in-mold transfer foil 90'. That is, the first bonding layer 34-1 has a larger outer shape than those of the decorating layer 33, the conductive wire layer 32, the print layer 31, and the second bonding layer 34-2.

When compared with materials of the decorating layer 33, the conductive wire layer 32, and the print layer 31, the material of the first bonding layer 34-1 is frequently more likely to peel off Therefore, if the decorating layer 33, the conductive wire layer 32, and the print layer 31 are prevented from protruding from the outer shape of the first bonding layer 34-1, the transfer layer 90 is more likely to peel from the base film, which makes the probability of a transfer failure in primary molding lower.

If, as described above, the protruding portion 34-1a is provided in the first bonding layer 34-1, the decorating layer 33, the conductive wire layer 32, and the print layer 31 can be prevented from protruding from the outer shape of the first bonding layer 34-1 due to misregistration of printing so that an occurrence of a transfer failure can be inhibited.

In the example of FIGS. 15 and 16, the same layer configuration as in-mold transfer foil according to the fifth embodiment is adopted and in addition, an outer shape in which the first bonding layer 34-1 protrudes from other layers is adopted. Alternatively, the bonding layer in contact with the base film in in-mold transfer foil in other configurations may similarly made larger than the outer shapes of the decorating layer 33, the print layer 31 for foil flow prevention and the like.

8. Examples and Comparative Examples

Examples According to the First Embodiment

Examples according to the first embodiment will be described below. The examples are examples in which a print layer for foil flow prevention is provided only on the side of a secondary molded layer of a conductive wire layer in in-mold transfer foil and various materials are applied to the print layer for foil flow prevention.

Example 1-1

Table 1 shows the structure of in-mold transfer foil when polyester resin is applied to the print layer for foil flow prevention. In this example, the thickness of the print, layer for foil flow prevention is 8 µm. The manufacturer name is shown by omitting "Inc. (Incorporated)".

TABLE 1

|  | Model | Manufacturer | Thickness |
|---|---|---|---|
| Ink of bonding layer to primary molding resin | IMB-003 | Teikoku Printing Inks Mfg | 5 µm |
| Ink of decorating layer | IPX-HF679 white | Teikolcu Printing Inks Mfg | 10 µm |
| Ink of conductive wire layer | DW-250H-5 | Toyobo | 10 µm |
| Ink of print layer for foil flow prevention | IPX-HF000 medium | Teikoku Printing Inks Mfg | 8 µm |
| Ink of bonding layer to secondary molding resin | IMB-HF006 | Teikoku Printing Inks Mfg | 5 µm |
| Base film | TN200 | Toyobo | 38 µm |

In Example 1-1, 15% of the following hardener is added to ink of the decorating layer and the print layer for foil flow prevention for use. By appropriately adding the hardener, the film can be made tougher to increase the effect of preventing a foil flow.

Model: 200 hardener

Manufacturer: Teikoku Printing Inks Mfg

Example 1-2

Table 2 shows the structure of in-mold transfer foil when polyurethane resin is applied to the print layer for foil flow prevention. In this example, the thickness of the print layer for foil flow prevention is 8 μm.

TABLE 2

|  | Model | Manufacturer | Thickness |
|---|---|---|---|
| Ink of bonding layer to primary molding resin | B-2 | Jujo Chemical | 5 μm |
| Ink of decorating layer | HIPET 9301 white | Jujo Chemical | 10 μm |
| Ink of conductive wire layer | DW-250H-5 | Toyobo | 10 μm |
| Ink of print layer for foil flow prevention | HIPET 9300 medium | Jujo Chemical | 8 μm |
| Ink of bonding layer to secondary molding resin | G-2S | Jujo Chemical | 5 μm |
| Base film | TN200 | Toyobo | 38 μm |

In Example 1-2, 10% of the following hardener is added to ink of the decorating layer and the print layer for foil flow prevention for use.

Model: JA-950

Manufacturer: Juju Chemical

Example 1-3

Table 3 shows the structure of in-mold transfer foil when cellulose resin is applied to the print layer for foil flow prevention. In this example, the thickness of the print layer for foil flow prevention is 8 μm.

TABLE 3

|  | Model | Manufacturer | Thickness |
|---|---|---|---|
| Ink of bonding layer to primary molding resin | B-2 | Jujo Chemical | 5 μm |
| Ink of decorating layer | HIPET 9301 white | Jujo Chemical | 10 μm |
| Ink of conductive wire layer | DW-250H-5 | Toyobo | 10 μm |
| Ink of print layer for foil flow prevention | HRI RX01 | Seiko advance | 8 μm |
| Ink of bonding layer to secondary molding resin | G-2S | Jujo Chemical | 5 μm |
| Base film | TN200 | Toyobo | 38 μm |

In Example 1-3, 10% of the following hardener is added to ink of the decorating layer and the print layer for foil flow prevention for use.

a) Hardener of the print layer for foil flow prevention

Model: H hardener

Manufacturer: Seiko advance b) Hardener of the decorating layer

Model: JA-950

Manufacturer: Jujo Chemical

Example 1-4

Table 4 shows the structure of in-mold transfer foil when polyimide resin is applied to the print layer for foil flow prevention. In this example, the thickness of the print layer for foil flow prevention is 8 μm.

TABLE 4

|  | Model | Manufacturer | Thickness |
|---|---|---|---|
| Ink of bonding layer to primary molding resin | B-2 | Jujo Chemical | 5 μm |
| Ink of decorating layer | HIPET 9301 white | Jujo Chemical | 10 μm |
| Ink of conductive wire layer | DW-250H-5 | Toyobo | 10 μm |
| Ink of print layer for foil flow prevention | Q-IP-1022E | PI R&D Co., Ltd. | 8 μm |
| Ink of bonding layer to secondary molding resin | G-2S | Jujo Chemical | 5 μm |
| Base film | TN200 | Toyobo | 38 μm |

Example 1-4, 10% of the following hardener is added to ink of the decorating layer for use. In this example, the hardener is added to only the decorating layer, but may a so be added to the print layer for foil flow prevention.

Model: JA-950

Manufacturer: Jujo Chemical

Examples According to the Second Embodiment

Examples according to the second embodiment will be described below. The examples are examples in Which a print layer for foil flow prevention is provided on both sides of a primary molded layer and a secondary molded layer of a conductive wire layer in in-mold transfer foil and various materials are applied to the print layers for foil flow prevention.

Example 24

Table 5 shows the structure of in-mold transfer foil when polyester resin is applied to the print layer for foil flow prevention. In this example, the thickness of the print layer for foil flow prevention is 8 μm.

TABLE 5

|  | Model | Manufacturer | Thickness |
|---|---|---|---|
| Ink of bonding layer to primary molding resin | IMB-003 | Teikoku Printing Inks Mfg | 5 μm |
| Ink of decorating layer | IPX-HF 679 white | Teikoku Printing Inks Mfg | 10 μm |
| Ink of print layer for foil flow prevention | IPX-HF000 medium | Teikoku Printing Inks Mfg | 8 μm |
| Ink of conductive wire layer | DW-250H-5 | Toyobo | 10 μm |
| Ink of print layer for foil flow prevention | IPX-HF000 medium | Teikoku Printing Inks Mfg | 8 μm |
| Ink of bonding layer to secondary molding resin | IMB-HF006 | Teikoku Printing Inks Mfg | 5 μm |
| Base film | TN200 | Toyobo | 38 μm |

In Example 2-1, 15% of the following hardener is added to ink of the decorating layer and the print layer for foil flow prevention for use.

Model: 200 hardener

Manufacturer: Teikoku Printing Inks Mfg

Example 2-2

Table 6 shows the structure of in-mold transfer foil when polyurethane resin is applied to the print layer for foil flow prevention. In this example, the thickness of the print layer for foil flow prevention is 8 μm.

TABLE 6

|  | Model | Manufacturer | Thickness |
|---|---|---|---|
| Ink of bonding layer to primary molding resin | B-2 | Jujo Chemical | 5 μm |
| Ink of decorating layer | HIPET 9301 white | Jujo Chemical | 10 μm |
| Ink of print layer for foil flow prevention | HIPET 9300 medium | Jujo Chemical | 8 μm |
| Ink of conductive wire layer | DW-250H-5 | Toyobo | 10 μm |
| Ink of print layer for foil flow prevention | HIPET 9300 medium | Jujo Chemical | 8 μm |
| Ink of bonding layer to secondary molding resin | G-2S | Jujo Chemical | 5 μm |
| Base film | TN200 | Toyobo | 38 μm |

In Example 2-2, 10% of the following hardener is added to ink of the decorating layer and the print layer for foil flow prevention for use.
Model: JA-950
Manufacturer: Jujo Chemical

Example 2-3

Table 7 shows the structure of in-mold transfer foil when cellulose resin is applied to the print layer for foil flow prevention. In this example, the thickness of the print layer for foil flow prevention is

TABLE 7

|  | Model | Manufacturer | Thickness |
|---|---|---|---|
| Ink of bonding layer to primary molding resin | B-2 | Jujo Chemical | 5 μm |
| Ink of decorating layer | HIPET 9301 white | Jujo Chemical | 10 μm |
| Ink of print layer for foil flow prevention | HRI RX01 | Seiko advance | 8 μm |
| Ink of conductive wire layer | DW-250H-5 | Toyobo | 10 μm |
| Ink of print layer for foil flow prevention | HRI RX01 | Seiko advance | 8 μm |
| Ink of bonding layer to secondary molding resin | G-2S | Jujo Chemical | 5 μm |
| Base film | TN200 | Toyobo | 38 μm |

In Example 2-3, 10% of the following hardener is added to ink of the decorating layer and the print layer for foil flow prevention for use.
a) Hardener of the print layer for foil flow prevention
Model: H hardener
Manufacturer: Seiko advance
b) Hardener of the decorating layer
Model: JA-950
Manufacturer: Jujo Chemical

Example 2-4

Table 8 shows the structure of in-mold transfer foil when polyimide resin is applied to the print layer for foil flow prevention. In this example, the thickness of the print layer for foil flow prevention is 8 μm.

TABLE 8

|  | Model | Manufacturer | Thickness |
|---|---|---|---|
| Ink of bonding layer to primary molding resin | B-2 | Jujo Chemical | 5 μm |
| Ink of decorating layer | HIPET 9301 white | Jujo Chemical | 10 μm |
| Ink of print layer for foil flow prevention | Q-IP-1022E | PI R&D Co., Ltd. | 8 μm |
| Ink of conductive wire layer | DW-250H-5 | Toyobo | 10 μm |
| Ink of print layer for foil flow prevention | QIP-1022E | PI R&D Co., Ltd. | 8 μm |
| Ink of bonding layer to secondary molding resin | G-2S | Jujo Chemical | 5 μm |
| Base film | TN200 | Toyobo | 38 μm |

In Example 2-4, 10% of the following hardener is added to ink of the decorating layer for use. In this example, the hardener is added to only the decorating layer, but may also be added to the print layer for foil flow prevention.
Model: JA-950
Manufacturer: Jujo Chemical

Conditions for Creating In-Mold Transfer Foil of Examples (1. Printing Conditions)

A screen mask using a 250-mesh polyester mesh is used for the conductive wire layer and a screen mask using a 200-mesh polyester mesh is used for other layers to print each layer at an angle of squeegee of 70 degrees and a squeegee speed of 25 mm/s.

2. Conditions for Heat Treatment for Drying/Curing 2-1. Examples other than Examples 1-4, 2-4

After printing each layer, each layer is dried at 90° C. for 10 min and stacked and when all layers are stacked, the stacked layers are subjected to heat treatment at 140° C. for 60 min.

2-2. Examples 1-4, 2-4

After printing each layer, the print layer for foil flow prevention is dried at 140° C. for 10 min and other layers are dried at 90° C. for 10 min and stacked and when all layers are stacked, the stacked layers are subjected to heat treatment at 150° C. for 60 min.

Comparison evaluation of Examples and Comparative Examples

Next, results of experiments evaluating comparisons of Examples 1-1 to 1-4 according to the first embodiment, Examples 2-1 to 2-4 according to the second embodiment, and Comparative Examples. First, two examples of in-mold transfer foil in which the material or thickness of the print layer for foil flow prevention does not satisfy conditions of the present disclosure will be described as Comparative Examples.

Comparative Example 1

Table 9 shows the structure of in-mold transfer foil when resin (epoxy resin) other than the resin specified by the present disclosure is applied to the print layer for foil flow prevention.

TABLE 9

|  | Model | Manufacturer | Thickness |
|---|---|---|---|
| Ink of bonding layer to primary molding resin | B-2 | Jujo Chemical | 5 μm |
| Ink of decorating layer | HIPET 9301 white | Jujo Chemical | 10 μm |
| Ink of conductive wire layer | DW-250H-5 | Toyobo | 10 μm |
| Ink of print layer for foil flow prevention | NT-01UV | NITTO DENKO CORP. | 8 μm |
| Ink of bonding layer to secondary molding resin | G-2S | Jujo Chemical | 5 μm |
| Base film | TN200 | Toyobo | 38 μm |

In Comparative Example 1, the material of the print layer for foil flow prevention is epoxy ultraviolet curing resin and ultraviolet rays are irradiated for curing such that the integrated quantity of light becomes 1000 millijoule.

10% of the following hardener is added to ink of the decorating layer for use.
Model: JA-950
Manufacturer: Jujo Chemical Comparative Example 2

Table 10 shows the structure of in-mold transfer foil the resin (polyurethane resin) specified by the present disclosure is applied to the print layer for foil flow prevention, but the thickness is insufficient. In this example, the thickness of the print layer for foil flow prevention is 1 μm.

TABLE 10

|  | Model | Manufacturer | Thickness |
|---|---|---|---|
| Ink of bonding layer to primary molding resin | B-2 | Jujo Chemical | 5 μm |
| Ink of decorating layer | HIPET 9301 white | Jujo Chemical | 10 μm |
| Ink of conductive wire layer | DW-250H-5 | Toyobo | 10 μm |
| Ink of print layer for foil flow prevention | HIPET 9300 medium | Jujo Chemical | 1 μm |
| Ink of bonding layer to secondary molding resin | G-2S | Jujo Chemical | 5 μm |
| Base film | TN200 | Toyobo | 38 μm |

Figure 17:
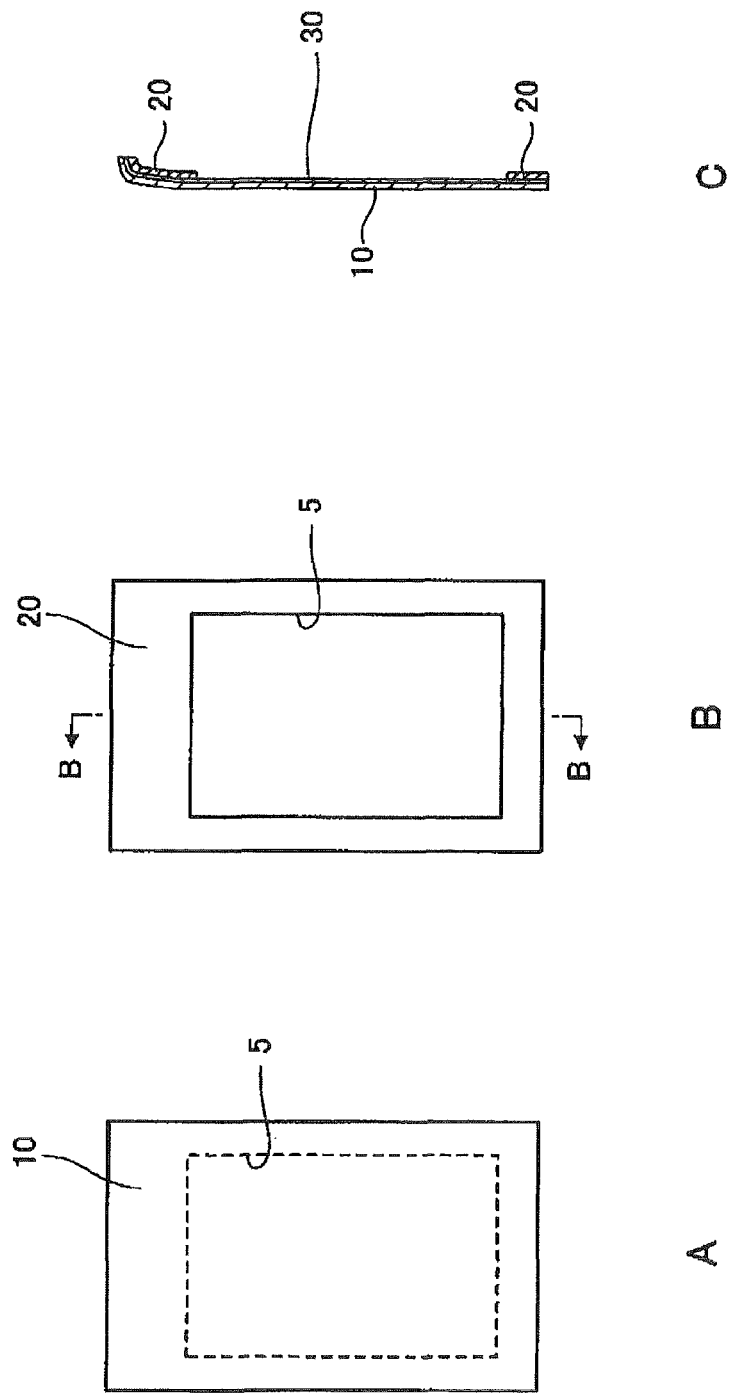
FIGS. 17A, 17B, and 17C are diagrams showing an outer shape of a primary molded layer, the outer shape of a secondary molded layer, and a cross section of a two-color molded product of each example respectively.
Figure 18:
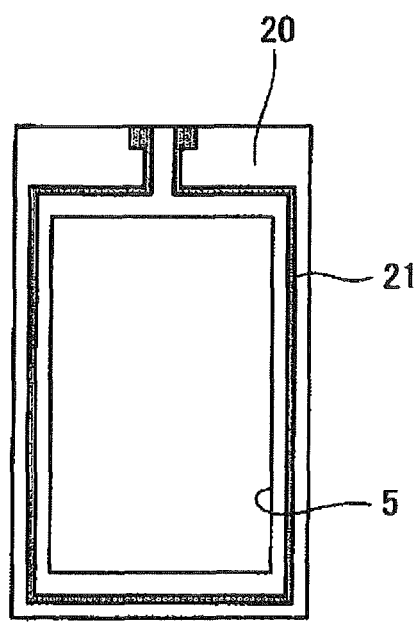
FIG. 18 is a plan view showing a physical relationship between the shape of a conductive wire of a transfer layer and the secondary molded layer in an example.

In Comparative Example 2, 10% of the following hardener is added to ink of the decorating layer and the print layer for foil flow prevention for use.
Model: JA-950
Manufacturer: Jujo Chemical Overview of Comparison Experiments How harsh molding conditions can the transfer layer of in-mold transfer foil of Examples and Comparative Example endure was compared by changing the peak pressure and filling time of molding conditions of a secondary molded layer FIGS. 17A, 17B, and 17C are diagrams showing the outer shape of the primary molded layer, the outer shape of the secondary molded layer, and the cross section of a two-color molded product of each example respectively. FIG. 18 is a plan view showing a physical relationship between the shape of a conductive wire of the transfer layer and the secondary molded layer in an example.

Overview of Two-Color Molded Products Produced in Comparison Experiments

1) Experiments to produce two-color molded products as shown in FIGS. 17A, 17B, and 17C were performed by transferring in-mold transfer foil of Examples and Comparative Examples to primary molded layer formed using transparent acrylic resin and further molding a secondary molded layer using black ABS resin. FIG. 17A is a diagram showing the outer shape of a primary molded layer. FIG. 17B is a diagram showing the outer shape of a secondary molded layer. FIG. 17C is a diagram showing the cross section (cross section in the position of B-B in FIG. 17B) of a two-color molded product.

2) The conductive wire layer of the transfer layer has the shape as shown in FIG. 18 and whether a conductive wire 21 is broken is tested using a tester after secondary molding.

3) Other layers than the conductive-wire layer are solid print layers like covering the shape of the primary molded layer in FIG. 11A and are evaluated visually to see whether a foil flow occurs after secondary molding.

Details of Molding Condition Settings for Secondary Molding

Figure 19:
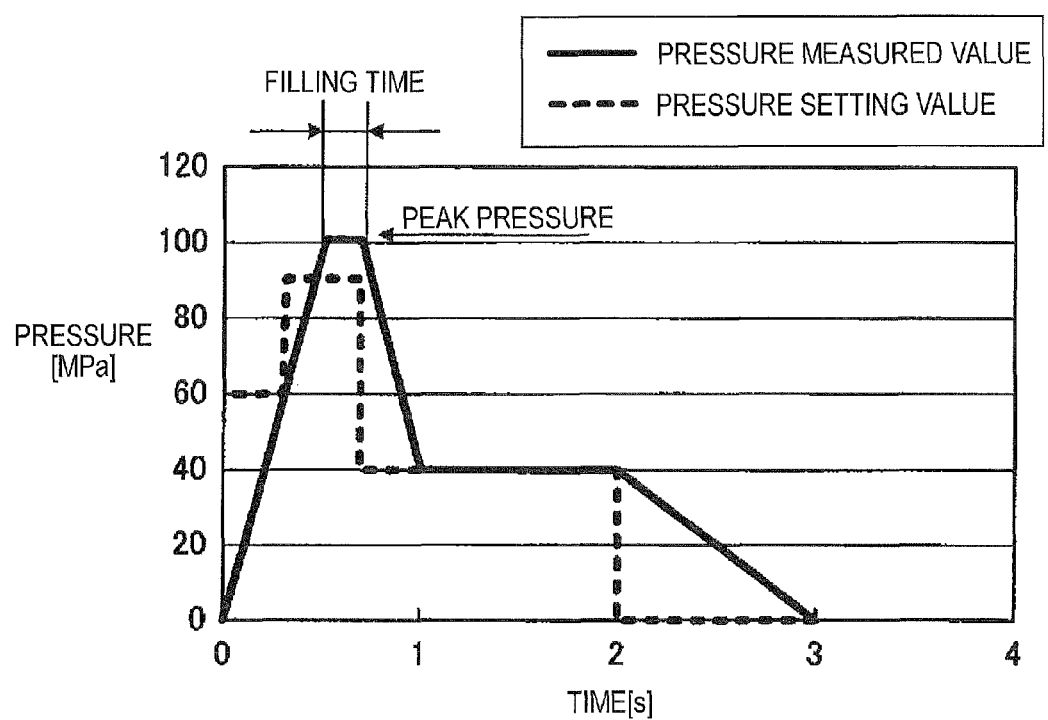
FIG. 19 is a graph showing a relationship between pressure and time during secondary molding.

Molding is performed by changing the peak pressure and filling time in the pressure profile for secondary molding as shown in FIG. 19 and an evaluation is done to see whether (1) a foil flow occurs and (2) breaking of the conductive wire layer occurs.

Experiment 1

The filling time during secondary molding is fixed to 0.3 s to examine the raised level of peak pressure at which a foil flow/breaking of a wire occurs.

Experiment 2

The peak pressure during secondary molding is fixed to 150 MPa to examine the increased length of filling time when a foil flow/breaking of a wire occurs.

Results of Comparison Experiments

Results of Experiment 1

The peak pressure at which a foil flow occurs is as shown in Table 11 and therefore, neither foil flow nor breaking of a wire occurs in all Examples when the peak pressure is 150 MPa or less. In Comparative Examples, by contrast, a foil flow/breaking of a wire occurs when the peak pressure is 100 MPa or less.

TABLE 11

|  | Peal pressure |
|---|---|
| Example | >150 MPa |
| Comparative Example 1 | 90 MPa |
| Comparative Example 2 | 100 MPa |

Results of Experiment 2

The filling time when a foil flow occurs is as shown in Table 12 and therefore, neither foil flow nor breaking of a wire occurs in all Examples when the filling time is 1 s or less. In Comparative Examples, by contrast, a foil flow/breaking of a wire occurs when the filling time is 0.4 s or less.

Similar effects are also obtained when secondary molding is performed by using in-mold transfer foil in which a print layer for foil flow prevention is formed on upper and lower sides of the conductive wire layer.

TABLE 12

|  | Filling time |
| --- | --- |
| Example | >1 s |
| Comparative Example 1 | 0.3 s |
| Comparative Example 2 | 0.4 s |

Photos of a Foil flow that Occurs in Comparative Examples and Comparison with Examples FIGS. 20A and 20B are explanatory views showing examples of molded products (Comparative Examples 1, 2) in which a foil flow occurs and FIG. 20C is an explanatory view showing an example of a molded product using in-mold transfer foil according to the present disclosure.

FIGS. 20A to 20C are photos when two-color molded products are viewed in the same orientation and there is a gate to provide secondary molding resin on the lower side so that the secondary molding resin flows upward from below in photos. When, like the photo (FIG. 20C), there is no foil flow at all when viewed from the side of the primary molded layer 10, only the while decorating layer 33 is visible through the transparent acrylic resin and transparent bonding layer. In Comparative Examples 1, 2 in which a foil flow shown in FIGS. 20A and 20B occurs, however, the decorating layer 33 is carried away and damaged by the secondary molding resin and black secondary molding resins 20b1 to 20b4 below are visible. In the two-color molded product of Example of FIG. 20C in which no foil flow occurs, by contrast, only the white decorating layer 33 is visible.

The present technology may also be configured as below (1)

A molded product including:

a primary molded layer;

a transfer layer that includes at least a decorating layer and a print layer for foil flow prevention including one of polyester, polyurethane, polyimide and cellulose, or a mixture obtained by combining two or more of polyester, polyurethane, polyimide and cellulose as a main component, and is transferred to a surface of the primary molded layer, the decorating layer and the print layer for foil flow prevention being arranged in increasing order of distance from a side of the primary molded layer; and a secondary molded layer formed on the side of the print layer for foil prevention of the transfer layer.

(2)

The molded product according to (1), wherein the print layer for foil flow prevention has a thickness of 2 μm to 40 μm.

(3)

The molded product according to (1) or (2), further including:

a conductive wire layer whose distance from the primary molded layer is farther than the decorating layer and nearer than the print layer for foil flow prevention.

The molded product according to any one of (1) to (3), wherein the print layer for foil flow prevention is formed on upper and lower sides of the conductive wire layer.

(5)

The molded product according to any one of (1) to (4), wherein the print layer for foil flow prevention has a thickness of 5 μm to 20 μm.

(6)

The molded product according to any one of (1) to (5), further including:

a bonding layer formed on a side of the secondary molded layer of the transfer layer, wherein the bonding layer has an outer shape larger than outer shapes of the decorating layer and the print layer for foil flow prevention of the transfer layer.

(7)

A molded product including:

at least a primary molded layer, a decorating layer, and a print layer for foil flow prevention including one of polyester, polyurethane, polyimide and cellulose, or a mixture obtained by combining two or more of polyester, polyurethane, polyimide and cellulose as a main component, the print layer for foil flow prevention and the decorating layer being arranged in increasing order of distance from a side of the primary molded layer; and a transfer layer transferred to a surface: of the primary molded layer, and a secondary molded layer formed on a side of the decorating layer of the transfer layer.

(8)

The molded product according to (7), wherein the print layer for foil flow prevention has a thickness of 2 μm to 40 μm.

(9)

The molded product according to (7) or (8), further including:

a conductive wire layer whose distance from the primary molded layer is farther than the print layer for foil flow prevention and nearer than the decorating layer.

(10)

The molded product according to any one of (7) to (9), wherein the print layer for foil flow prevention is formed on upper and lower sides of the conductive wire layer.

(11)

The molded product according to any one of (7) to (10), wherein the print layer for foil flow prevention has a thickness of 5 μm to 20 μm.

(12)

The molded product according to any one of (7) to (11), further including:

a bonding layer formed on a side of the secondary molded layer of the transfer layer, wherein the bonding layer has an outer shape larger than outer shapes of the decorating layer and the print layer for foil flow prevention of the transfer layer.

(13)

In-mold transfer foil including:

a base film having a mold release characteristic; and a transfer layer including, on the base film, at least a print layer for foil flow prevention including one of polyester, polyurethane, polyimide and cellulose, or a mixture obtained by combining two or more of polyester, polyurethane, polyimide and cellulose as a main component, a decorating layer, and a bonding layer to which a primary molded layer is bonded, the print layer for foil flow prevention, the decorating layer, and the bonding layer being arranged in increasing order of distance from a side of the base film.

(14)

In-mold transfer foil including:

a base film having a mold release characteristic; and a transfer layer including, on the base film, at least a print layer for foil flow prevention including one of polyester, polyurethane, polyimide and cellulose, or a mixture obtained by combining two or more of polyester, polyurethane, polyimide and cellulose as a main component, a decorating layer, and a bonding layer to which a primary molded layer is bonded, the decorating layer, the print layer for foil flow prevention, and the bonding layer being arranged in increasing order of distance from a side of the base film.

(15)

The in-mold transfer foil according to (13) or (14), further including:

a bonding layer formed on the side of the base film of the transfer layer, wherein the bonding layer has an outer shape larger than outer shapes of the decorating layer and the print layer for foil flow prevention of the transfer layer, The present disclosure is not limited to each embodiment described above and can naturally take other various modifications application examples without deviating from the gist described in claims. That is, examples of each embodiment described above are preferred concrete examples of the present disclosure and thus, various limitations that are technically preferable are imposed. However, the technical scope of the present disclosure is not limited to these forms if not specifically mentioned to limit the present disclosure in each description. For example, used materials cited in the above description and used quantities thereof, the treatment time, the treatment order, and numerical conditions for each parameter are only suitable examples and also dimensions, shapes, and arrangement relationships in each diagram used in the description are only schematic.

In addition, for example, a print layer for foil flow prevention may be used as a decorating layer.

REFERENCE SIGNS LIST 3 base film
5 window portion
10 primary molded layer
10' primary molding resin
20 secondary molded layer
20' secondary molding resin
30 transfer layer
30' in-mold transfer foil
31, 31-1, 31-2 print layer (print layer for foil flow prevention)
32 conductive wire layer
33 decorating layer
34, 34-1, 34-2 bonding layer
34-1a protruding portion of a bonding layer
40, 50, 60, 70, 80, 90 transfer layer
40', 50', 60', 70', 80', 90' in-mold transfer foil
51 cavity plate
51a cavity
51b runner
51c gate
52 first core plate
52a first core
53 second core plate
53a second core
53b runner
53c gate
100 front cover (molded product)
100a main surface
100b side face It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A molded product comprising:
a primary molded layer;
a transfer layer that includes at least a decorating layer, a print layer for foil flow prevention including one of polyester, polyurethane, polyimide and cellulose, or a mixture obtained by combining two or more of polyester, polyurethane, polyimide and cellulose as a main component and a bonding layer including one of acrylic, polyester, or polycarbonate, and is transferred to a surface of the primary molded layer, the decorating layer, the print layer for foil flow prevention and the bonding layer being arranged in increasing order of distance from a side of the primary molded layer;
a secondary molded layer formed on the side of the bonding layer of the transfer layer; and
a conductive wire layer whose distance from the primary molded layer is farther than the decorating layer and nearer than the print layer for foil flow prevention,
wherein the print layer for foil flow prevention has a thickness of 2 μm to 40 μm.

2. The molded product according to claim 1,
wherein the print layer for foil flow prevention is formed on upper and lower sides of the conductive wire layer.

3. A molded product comprising:
a primary molded layer;
a transfer layer that includes at least a decorating layer, a print layer for foil flow prevention including one of polyester, polyurethane, polyimide and cellulose, or a mixture obtained by combining two or more of polyester, polyurethane, polyimide and cellulose as a main component and a bonding layer including one of acrylic, polyester, or polycarbonate, and is transferred to a surface of the primary molded layer, the decorating layer, the print layer for foil flow prevention and the bonding layer being arranged in increasing order of distance from a side of the primary molded layer; and
a secondary molded layer formed on the side of the bonding layer of the transfer layer,
wherein the bonding layer has an outer shape larger than outer shapes of the decorating layer and the print layer for foil flow prevention of the transfer layer.

4. In-mold transfer foil comprising:
a base film having a mold release characteristic; and
a transfer layer including, on the base film, at least a first bonding layer including one of acrylic, polyester, or polycarbonate and to which a secondary molded layer is bonded, a print layer for foil flow prevention including one of polyester, polyurethane, polyimide and cellulose, or a mixture obtained by combining two or more of polyester, polyurethane, polyimide and cellulose as a main component, a decorating layer, and a second bonding layer to which a primary molded layer is bonded, the first bonding layer, the print layer for foil flow prevention, the decorating layer, and the second bonding layer being arranged in increasing order of distance from a side of the base film.

5. The in-mold transfer foil according to claim 4,
wherein the first bonding layer has an outer shape larger than outer shapes of the decorating layer and the print layer for foil flow prevention of the transfer layer.

* * * * *